United States Patent
Häggebrant et al.

(10) Patent No.: US 11,658,679 B2
(45) Date of Patent: May 23, 2023

(54) METHODS, DEVICES AND SYSTEMS FOR EFFICIENT COMPRESSION AND DECOMPRESSION FOR HIGHER THROUGHPUT

(71) Applicant: ZEROPOINT TECHNOLOGIES AB, Gothenburg (SE)

(72) Inventors: Henrik Häggebrant, Bollebygd (SE); Daniel Moreau, Västra Frölunda (SE); Angelos Arelakis, Gothenburg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 84 days.

(21) Appl. No.: 17/415,047

(22) PCT Filed: Dec. 23, 2019

(86) PCT No.: PCT/SE2019/051342
§ 371 (c)(1),
(2) Date: Jun. 17, 2021

(87) PCT Pub. No.: WO2020/130929
PCT Pub. Date: Jun. 25, 2020

(65) Prior Publication Data
US 2022/0069840 A1    Mar. 3, 2022

(30) Foreign Application Priority Data

Dec. 21, 2018 (SE) .................................. 1851649-2

(51) Int. Cl.
*H03M 7/00* (2006.01)
*H03M 7/40* (2006.01)
*H03M 7/30* (2006.01)

(52) U.S. Cl.
CPC ............ *H03M 7/40* (2013.01); *H03M 7/3059* (2013.01); *H03M 7/6005* (2013.01); *H03M 7/6017* (2013.01)

(58) Field of Classification Search
CPC .... H03M 7/40; H03M 7/3059; H03M 7/6005; H03M 7/6017
(Continued)

(56) References Cited

U.S. PATENT DOCUMENTS 7,872,598 B2 *   1/2011   Baktir .................... H03M 7/425
                                                                341/51
10,268,380 B2 *  4/2019   Arelakis .............. H03M 7/6088
(Continued)

FOREIGN PATENT DOCUMENTS

WO    WO 1999/38120    7/1999
WO    WO 2013/102503   7/2013
(Continued)

OTHER PUBLICATIONS

European Search Report was dated Jul. 15, 2022 by the European Patent Office for European Application No. 19898478.3 (Applicant—Zeropoint Technologies) (9 pages).
(Continued)

*Primary Examiner* — Jean B Jeanglaude
(74) *Attorney, Agent, or Firm* — Ballard Spahr LLP

(57) ABSTRACT

A decompression system has a plurality of decompression devices in an array or chain layout for decompressing respective compressed data values of a compressed data block. A first decompression device is connected to a next decompression device, and a last decompression device is connected to a preceding decompression device. The first decompression device decompresses a compressed data value and reduces the compressed data block by extracting a codeword of the compressed data value and removing the
(Continued)

compressed data value from the compressed data block, retrieving a decompressed data value out of the extracted codeword, and passing the reduced compressed data block to the next decompression device. The last decompression device receives a reduced compressed data block from the preceding decompression device and decompresses another compressed data value by extracting a codeword of the other compressed data value, and retrieving another decompressed data value out of the extracted codeword.
Elected for publication; FIG. 8.

20 Claims, 18 Drawing Sheets

(58) Field of Classification Search
USPC ..................................................... 341/50, 51
See application file for complete search history.

(56) References Cited

U.S. PATENT DOCUMENTS

| | | | | |
|---|---|---|---|---|
| 10,403,004 | B2* | 9/2019 | Fenney | H04N 19/91 |
| 10,476,520 | B2* | 11/2019 | Arelakis | G06F 3/064 |
| 10,819,369 | B2* | 10/2020 | Arelakis | G06F 3/0608 |
| 2003/0058873 | A1 | 3/2003 | Geiger et al. | |
| 2007/0150497 | A1 | 6/2007 | De La Cruz et al. | |
| 2010/0141488 | A1* | 6/2010 | Baktir | H03M 7/425 |
| | | | | 341/67 |
| 2016/0087647 | A1 | 3/2016 | Fenney | |
| 2018/0138921 | A1* | 5/2018 | Arelakis | H03M 7/30 |
| 2018/0143770 | A1* | 5/2018 | Arelakis | H03M 7/6088 |

FOREIGN PATENT DOCUMENTS

| | | |
|---|---|---|
| WO | WO 2016/186563 | 11/2016 |
| WO | WO 2016/186564 | 11/2016 |
| WO | WO 2017/131578 | 8/2017 |

OTHER PUBLICATIONS

International Search Report and Written Opinion dated Mar. 27, 2020 by the International Searching Authority for International Application No. PCT/SE2019/051342, filed on Dec. 23, 2019 and published as WO 2020/130929 on Jun. 25, 2020 (Applicant—Zeropoint Technologies AB) (9 pages).

* cited by examiner

METHODS, DEVICES AND SYSTEMS FOR EFFICIENT COMPRESSION AND DECOMPRESSION FOR HIGHER THROUGHPUT

CROSS-REFERENCE TO RELATED APPLICATIONS

This application is a U.S. National Phase Application of International Application No. PCT/SE2019/051342, filed Dec. 23, 2019, which claims priority to Swedish Application No. 1851649-2, filed Dec. 21, 2018, each of which are hereby incorporated by reference in their entirety.

TECHNICAL FIELD

This subject matter generally relates to the field of data compression in electronic computers.

BACKGROUND

Data compression is a well-established technique that is used to reduce the size of the data. It is applied to data that are saved in the memory subsystem of a computer system to increase the memory capacity. It is also used when data are transferred either between different subsystems within a computer system or in general when the transfer takes place between two points in a data communication system comprising a communication network.

Data compression requires two fundamental operations: 1) compression (also referred to as encoding) that takes as input uncompressed data and transform them to compressed data by replacing data values by respective codewords (also mentioned as encodings, codings or codes) and 2) decompression (also referred to as decoding) which takes as input compressed data and transform them to uncompressed by replacing the codewords with the respective data values. Compression and decompression can be implemented in software, or hardware, or a combination of software and hardware realizing the respective methods, devices and systems.

Different compression algorithms and methods specify how to go from an uncompressed domain to a compressed domain and from a compressed domain to an uncompressed domain. Lossless compression algorithms do this in a controlled way so that the actual data values after decompression are the same as the original ones before being compressed. On the other hand, lossy compression algorithms manipulate the data set under compression, as a result the data values after decompression are different from the original and the original values cannot be retrieved (in lossy).

There is a variety of different algorithms to realize data compression but typically these can be categorized to two groups: Algorithms that use fixed-length (or fixed-width) codes to encode the data-to-compress, and algorithms that use variable-length (or variable-width) codes to encode the data-to-compress. An example data compression algorithm family that belong to the first group is dictionary-based algorithms that look up a given data-set (i.e., data under compression) in the dictionary and if it matches it uses the dictionary index to encode it with the dictionary location and/or the amount matched if it was a partial match. On the other hand, an example data compression algorithm that belong to the second group is the statistical compression algorithms, which are data dependent and can offer compression efficiency close to entropy because they assign variable-length (referred to also as variable-width) codes based on the statistical properties of the data values comprised in a given data set: short codewords are used to encode data values that appear frequently and longer codewords encode data values that appear less frequently. Huffman encoding is a known statistical compression algorithm.

A known variation of Huffman encoding that is used to accelerate decompression is canonical Huffman encoding. Based on this, codewords have the numerical sequence property meaning that codewords of the same length are consecutive integer numbers.

Examples of canonical Huffman-based compression and decompression mechanisms are presented in prior art. Such compression and decompression mechanisms can be used to realize Huffman-based compression and decompression.

For every compression algorithm, compression requires some time to convert uncompressed data to compressed data; decompression also requires some time to convert compressed data to uncompressed data. The exact amount of latency is typically subject to the algorithm used and the specific implementation. Furthermore, the throughput (amount of compressed and decompressed data respectively) is also subject to the specific algorithm used and the specific implementation.

Variable-length compression implementations typically compress uncompressed data by first dividing said uncompressed data in blocks. Blocking reduces the waiting time between compression of uncompressed words. The data block aimed to be compressed first is temporarily stored. Each word within said temporarily stored block shall be processed one after the other sequentially and replacing each one with the respective codeword (or leave it uncompressed if said compression allows it). The sequential working method is built in to the compression algorithm itself as there is no information stored on where each consecutive word shall begin within a compressed block. Hence, the only way to know where to store a compressed word N in a compressed block is to know where the compressed word N−1 ended. The latency through a compressor (i.e., the waiting time) can be defined as the time added from when an uncompressed block enters the compressor until the compressed version of that block exit the compressor.

Variable-length decompression also adds latency for the same reasons as compression. Since the boundaries are not known for the words within a decompressed block each word needs to be decompressed in order. The decompressor also works on a temporarily stored block on a word by word basis.

Prior art implementations of variable-length compression and decompression suffer from reduced throughput because variable-length compression and decompression have inherently sequential work-flow. The throughput penalty has its origin in the packing of words since there is no reference to where the word begins within a compressed block. By working on a word by word basis for a compressor, the temporary word used to store an uncompressed word will halt the compression of other blocks until the compressor has finished with the current block. The same problem is encountered in the decompressor when storing a temporary block to be decompressed. The decompressor will halt the decompression of other blocks until the current block is completely decompressed.

Besides the penalty of latency and throughput issues the decompressor has an extra complexity that is not present in the compressor. In the compressor there is typically one or a plurality of predetermined lengths for each uncompressed word within an uncompressed block. All uncompressed blocks are divided into a determined amount of uncompressed words depending on said predetermined length. The feeding mechanism for a word by word processing work flow from the temporary storage becomes trivial due to the predetermined word length. On the other hand, a temporary compressed word in a decompressor that is part or the whole compressed block comprises compressed words with an unknown word length since the words are compressed with variable-length codewords. The word length is unique for each compressed word within the block. Because of this, the word by word processing becomes nontrivial as detecting a specific codeword n depends on knowing at least the beginning of said codeword which depends further on having calculated the length of the previous codeword n−1 within said compressed word. Said calculated code length must be used as an input for shifting the detected codeword out of the said temporary word. The cost of the code detection unit and shift operation word is highly dependent on the number of words within a block and the maximum code length. Said cost translates to computational power demands if compression and decompression are implemented in software. In an alternative embodiment, said cost translates to logic depth if compression and decompression are implemented in hardware. In said hardware-based compressor and decompressor the logic depth affects the maximum clock frequency of each operation. Prior art uses pipelining to reduce the logic depth if said logic depth becomes too large for the target clock frequency. However, pipelining the code detection with feedback to the shifter of the temporary compressed word adds a plurality of stall cycles; the total number of stall cycles is equal to the number of compressed words of a compressed block times the number of clock cycles of processing through the codeword detection.

Prior art tries to tackle the throughput issues by parallelizing compression and decompression, i.e., by adding a plurality of compression and decompression instances if it is a hardware implementation. In particular for decompression, the number of decompressors is typically equivalent to the number of the stall cycles of one decompressor, however more decompressors can be added to decompress multiple compressed blocks. The introduced parallelism comes with two penalties. 1) When adding multiple decompressors it is not obvious how each and one of the decompressors will be fed with compressed blocks. A resource scheduler is needed to keep track of decompressors available for decompressing new compressed blocks. If the number of decompressors is equivalent to the number of stall cycles for one decompressor this will result in no stall cycles for the total collection of decompressors, requiring though a large number of decompressors thus resulting in an area penalty instead. This can potentially result in no throughput penalty, while the scheduler mechanism can become trivial since no back pressure is needed from the collection of decompressors. A round robin mechanism could be used to implement the scheduler. 2) When adding multiple decompressors, a controller is needed to collect the decompressed outputs and bookkeep the compressed blocks so that it associates the collected outputs with uncompressed blocks.

The present disclosure tackles these problems by realizing specific improvements in throughput within variable-length compression and decompression itself as well as when arranging multiple compressors and decompressors in parallelized compression and decompression.

SUMMARY

A first aspect of the present invention is a decompression system for decompressing a compressed data block in accordance with the appended independent claim 1. A second aspect of the present invention is a method for decompressing a compressed data block in accordance with the appended independent claim 11. A third aspect of the present invention is a compression system for compressing a data block in accordance with the appended independent claim 12. A fourth aspect of the present invention is a method for compressing a data block in accordance with the appended independent claim 17. Objectives, features and advantages of these aspects of the invention and some exemplary embodiments thereof are defined in the appended dependent claims.

DESCRIPTION OF DRAWINGS

FIG. 11 comprises a dual-end decompressor array comprising two decompressor arrays, one in FIG. 11A and the second in FIG. 11B, which each decompresses a logical half of a compressed block.

DETAILED TECHNICAL DESCRIPTION

Figure 1:
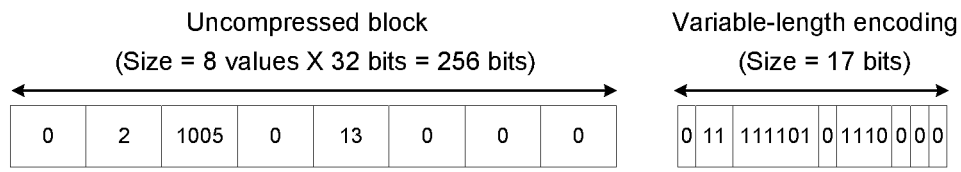
FIG. 1 illustrates on the left an uncompressed block of data values and, on the right, the same block in compressed form using variable-length. All the data values of the uncompressed block are replaced by the respective variable-length codewords.

Variable-length compression algorithms offer compression efficiency close to entropy because they assign variable-length (referred to also as variable-width) codes based on the statistical properties of the data values comprised in a given data set. However, variable-length compression and decompression suffer from high latency and reduced throughput due to the fact that variable-length compression and decompression are inherently sequential because the boundaries of compressed data are unknown due to the variable-length codeword that is used to encode a specific data value (also referred to as data symbol). FIG. 1, on the left, illustrates an example block of data values in uncompressed form wherein each uncompressed value has a width of 32 bits, and on the right the same block is illustrated in compressed form wherein all the block data values are compressed with variable-length encoding, for example Huffman encoding. The exemplary block of data values may be a processor cache-line, a memory page, a data stream, the content of one or a plurality of data packets in a network and in general any sequence of data that is compressed with variable-length encoding.

Figure 2:
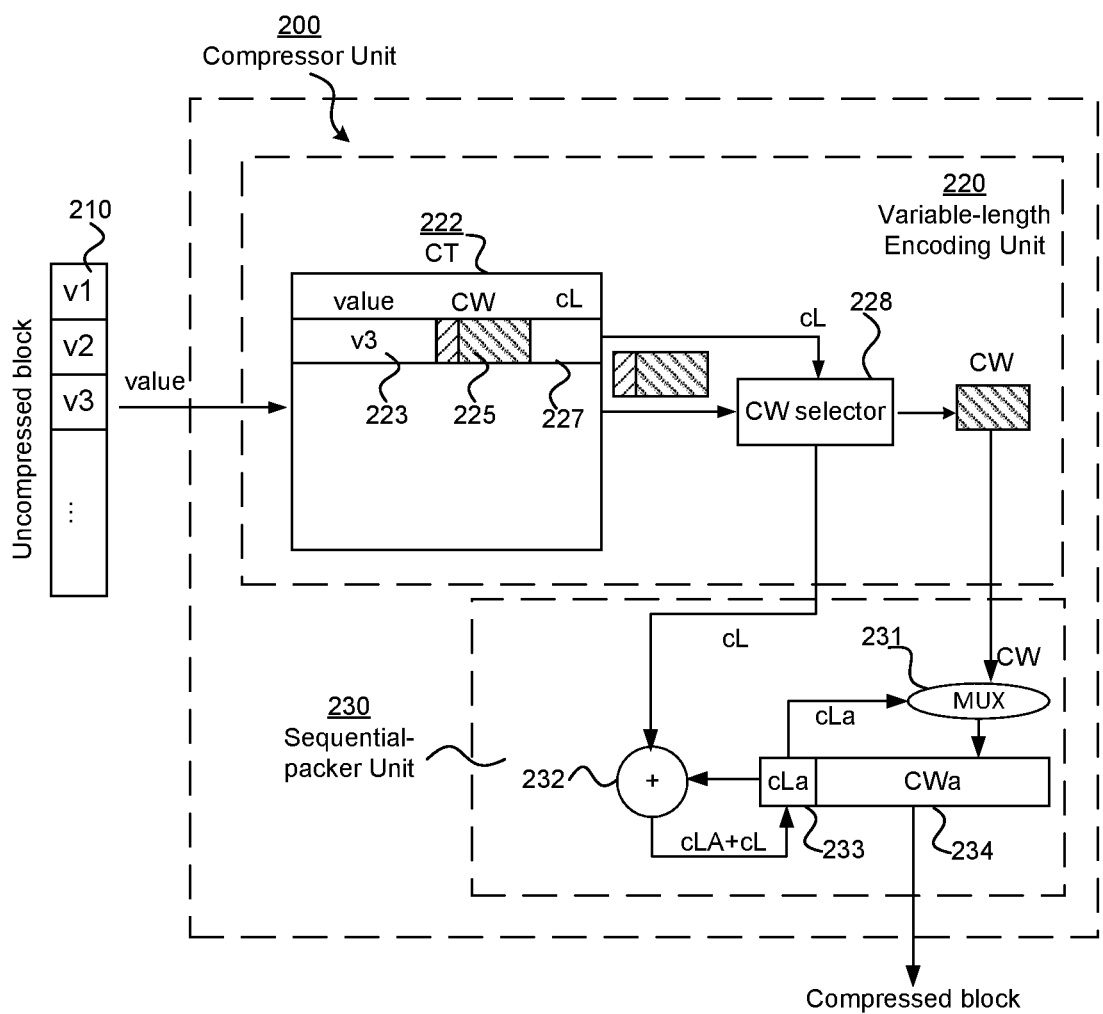
FIG. 2 illustrates a prior art compressor that is used to compress (or encode) blocks using variable-length Huffman encoding, as illustrated in FIG. 1.

An example embodiment of a compressor 200, which implements Huffman encoding e.g., canonical Huffman encoding, is illustrated in FIG. 2. It takes as input an uncompressed block, which is a stream of data values and comprises one or a plurality of data values generally denoted v1, v2, . . . vn. The unit 210, which can be a storage unit or an extractor of data value out from the uncompressed block, supplies the Variable-length Encoding Unit 220 with data values. The Variable-length Encoding Unit 220 comprises the Code Table (CT) 222 and the codeword (CW) selector 228. The CT 222 is a table that can be implemented as a Look Up Table (LUT) or as a computer cache memory (of any arbitrary associativity) and contains one or a plurality of entries; each entry comprises a value 223 that can be compressed using a codeword, a CW 225 and a codeword-length (cL) 227. Because the set of the various codewords used by statistical compression algorithms is of variable-length, they must be padded with zeros when they are saved in the CT 222 where each entry has a fixed-size width (codeword 225). The codeword-length 227 keeps the actual length of the variable-length encoding (e.g., in bits). The CW selector 228 uses the cL in order to identify the actual CW and discard the padded zeros. The selected CW and associated cL is then outputted to a unit that concatenates said CW to the rest of the compressed values that altogether form the compressed block. The unit that accomplishes this operation is called Sequential-packer unit (230). The unit successively accumulates the cL of prior outputted CW in order to find where to store the next matched CW in a process described in para 009. The accumulated cL and CW, cLa and CWa respectively, are stored in registers 233 and 234. When all values of the uncompressed block 210 are exhausted, the Sequential-packer unit outputs the final cLa and CWa.

Figure 3:
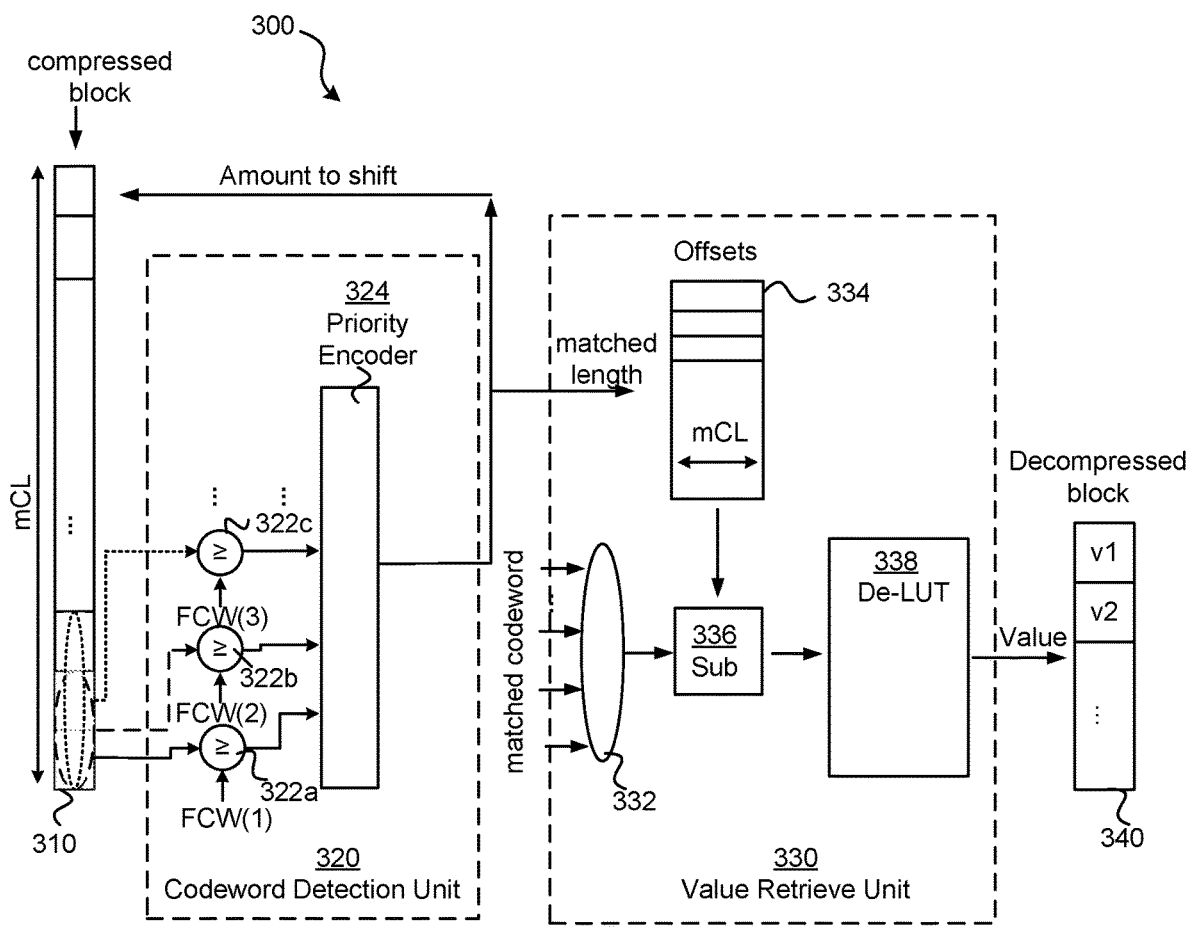
FIG. 3 illustrates a prior art decompressor that is used to decode (or decompress) blocks that were compressed using canonical Huffman encoding.

An example of a decompressor 300 from the prior art is illustrated in FIG. 3. Canonical Huffman decompression can be divided into two steps: Codeword detection and Value retrieve. Each of these steps is implemented by a unit: (1) Codeword Detection Unit (CDU) 320 and (2) Value Retrieve Unit (VRU) 330. The aim of CDU 320 is to find a valid codeword within a compressed sequence (i.e., the sequence of the codewords of the compressed data values). The CDU 320 comprises a set of comparators 322 and a priority encoder 324. Each comparator $322a,b,c$ compares each potential bit-sequence to a known codeword, which is in this example the First-assigned (at the time of code generation) canonical Huffman codeword (FCW) for a specific length. In alternative implementation, the last-assigned canonical Huffman codeword could be used too, but in that case the exact comparison made would be different. The maximum size of the aforementioned bit-sequence to be compared, which can be saved in a storage unit 310 (implemented for example as a FIFO or flip flops) and which determines the number of comparators and the maximum width of the widest of them, depends on the maximum length of a valid Huffman codeword (mCL) that is decided at code generation. However, this maximum length can be bounded to a specific value at design, compile, configuration or run time depending on the chosen implementation of such decompressor (e.g., in software or in hardware). The output of the comparators 322 is inserted into the priority encoder like structure 324 which outputs the length of the matched codeword (referred to as "matched length" in FIG. 3). Based on this, the detected valid codeword ("matched codeword") is extracted from the bit-sequence which is saved in a storage unit 310; the bit sequence is shifted by as many positions as the "matched length" defines and the empty part is loaded with the next bits of the compressed sequence so that the CDU 320 can determine the next valid codeword.

The Value Retrieve Unit (VRU) 330, on the other hand, comprises the Offset table 334, a subtractor unit 336 and the Decompression Look Up Table (DeLUT) 338. The "matched length" from the previous step is used to determine an offset value (saved in the Offset table 334) that must be subtracted (336) from the arithmetic value of the matched codeword, determined also in the previous step, to get the address of the DeLUT 338 where the original data value that corresponds to the detected codeword can be retrieved from it and attached to the rest of decompressed values that are kept in the Decompressed block 340. The operation of the decompressor is repeated until all the values that are saved compressed in the input compressed sequence (mentioned as compressed block in FIG. 3) are retrieved as uncompressed data values v1, v2, . . . , vn.

Figure 4:
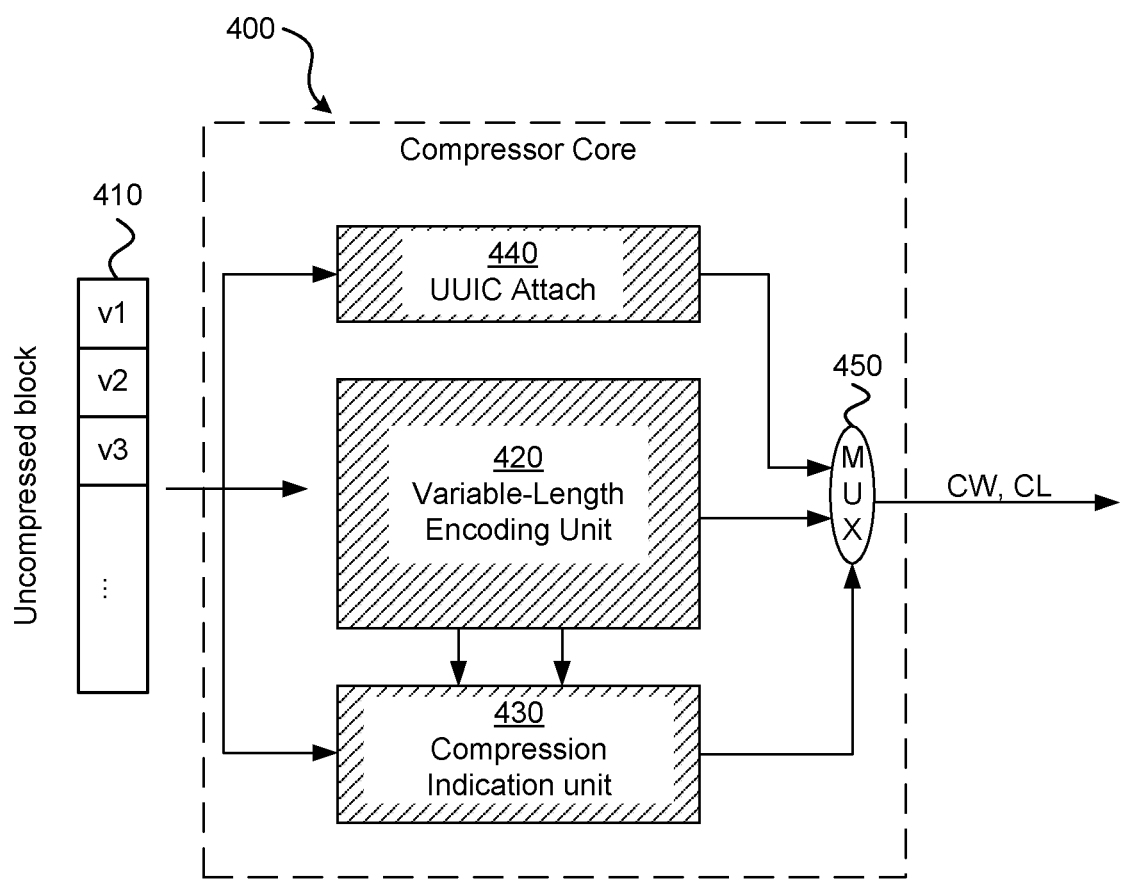
FIG. 4 illustrates the compressor of FIG. 2 modified and extended to determine compressible and uncompressible data values in a block of data values, encode the compressible data values by replacing them with variable-length codewords and assign to the uncompressible data values a unique codeword.

An alternative embodiment of a compressor is depicted in FIG. 4. Said compressor modifies and extends the compressor of FIG. 2 with a Compression Indication Unit 430 to determine compressible and uncompressible values, compress the compressible values with variable-length encoding 420 and store the uncompressible values with a unique codeword 440 so that the compressed block comprises a mix of compressed and uncompressed values selected with the multiplexor 450.

Figure 5:
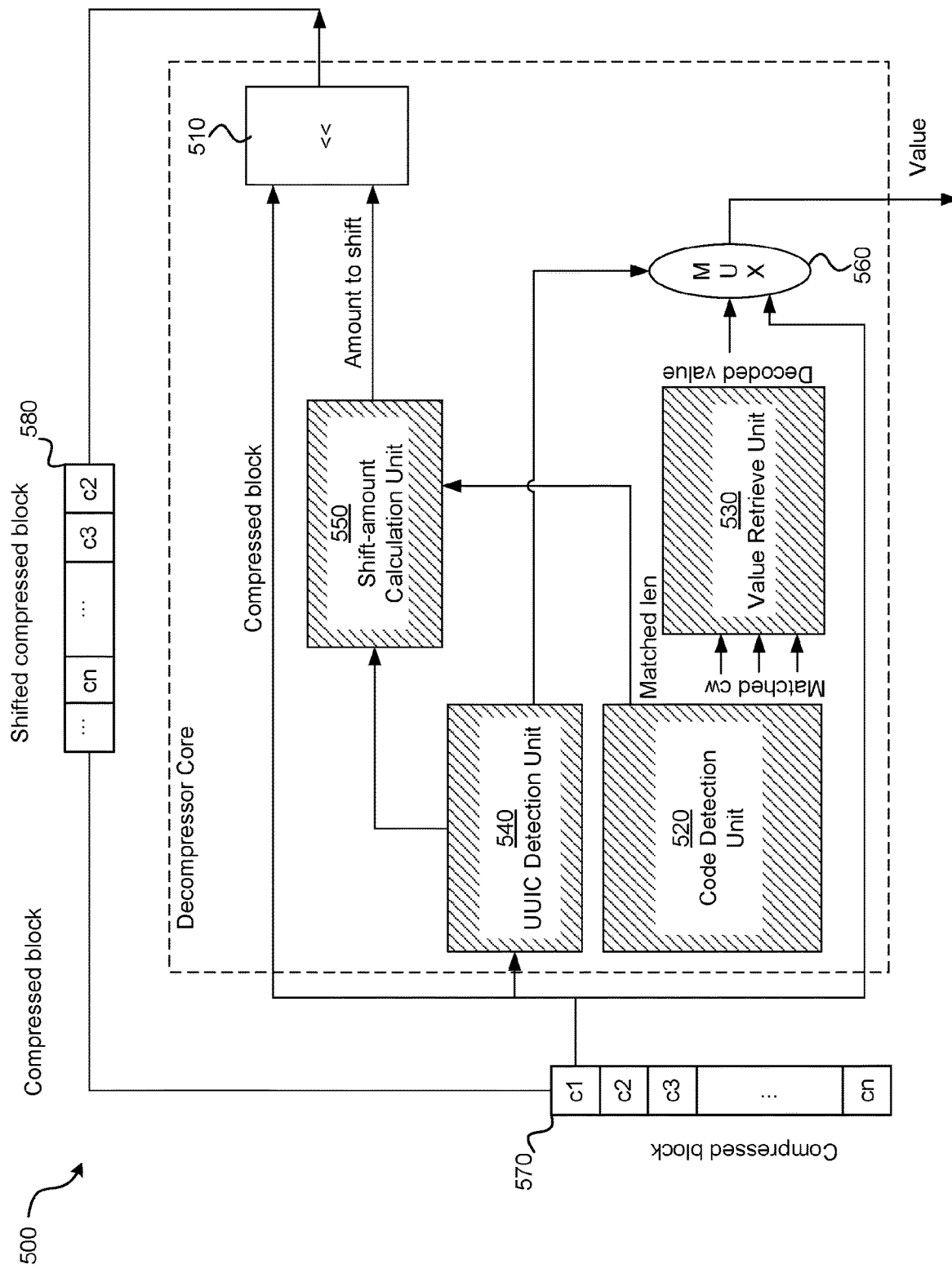
FIG. 5 illustrates the decompressor of FIG. 3 modified and extended to decompress a mix of compressed and uncompressed values, wherein this mix is compressed with the compressor of FIG. 4, wherein compressed values are compressed with variable-length encoding and uncompressed values have been attached with a unique codeword.

An alternative embodiment of a decompressor is depicted in FIG. 5. Said decompressor modifies and extends the decompressor of FIG. 3 with a unique codeword detection unit 540 on the top of the variable-length code detection unit 520 to be able to decompress compressed and uncompressed values within a compressed block that comprises a mix of compressed and uncompressed values.

Figure 6:
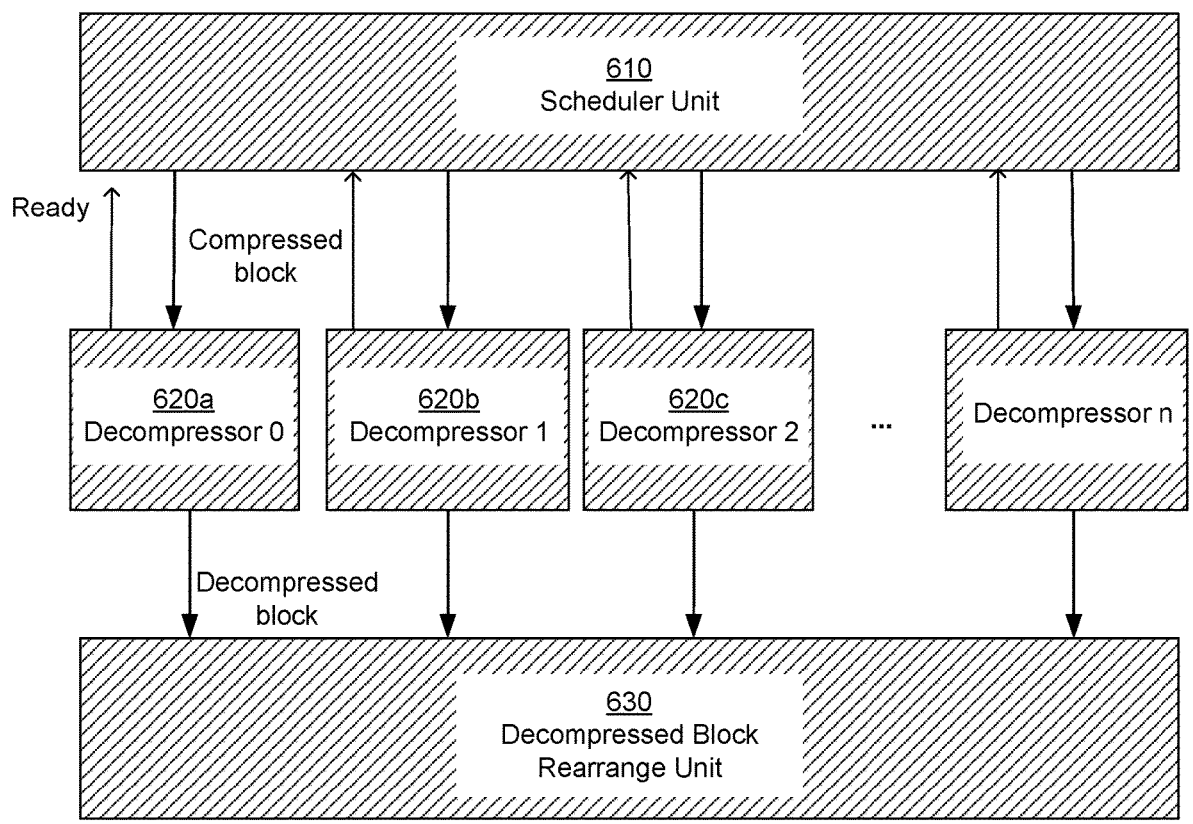
FIG. 6 illustrates a system with a plurality of decompressors that are used in parallel to decompress a multitude of compressed blocks.

Prior art methods address the low throughput issue of a decompressor uses multiple instances of the complete decompressor as depicted in FIG. 6. In a first embodiment, the number of decompressors can be as many as the number of words within a compressed block. In a further embodiment where the target for the decompression throughput is guaranteed to be one decompressed word per cycle, the number of decompressors must be equal to at least the number of cycles a single decompressor stalls the flow through its own instance. The dependency between the number of stall cycles and number of instances needed to reach high throughput is not a desirable property as the introduced parallelism comes with two issues that can be solved with additional resources: 1) Feeding each decompressor among the plurality of them running in parallel with compressed blocks so that neither they suffer from starvation at any point in time nor decompressing a compressed block is stalled. This can be solved using a resource scheduler 610 to keep track of decompressors 620a, 620b, 630c, etc available for decompressing various blocks in parallel. 2) When adding multiple decompressors a further mechanism, referred to as Decompressed Block Rearrange Unit 630, is needed to keep track of and collect the decompressed data belonging to the various blocks decompressed in parallel. The Decompressed Block Rearrange Unit 630 must be able to handle the outputs from all decompressors and present the final decompressed output in the order the resource scheduler intended.

Decompressor

This disclosure addresses the issue of limited throughput encountered in a single decompressor as well as in the system where multiple decompressors are used in parallel, by reducing the complexity (no scheduler is needed) and the area overhead by utilizing only a sufficient number of decompressors.

In a first embodiment of the present disclosure, the decompression method implemented by the decompressor of FIG. 3 and FIG. 5 must be redefined so that 1) each decompression method or device is responsible for decompressing only one word instead of all the words within the compressed block as opposed to prior art; and 2) a plurality of said redefined decompressors are arranged in an array (or chain) to decompress a full block.

Figure 7:
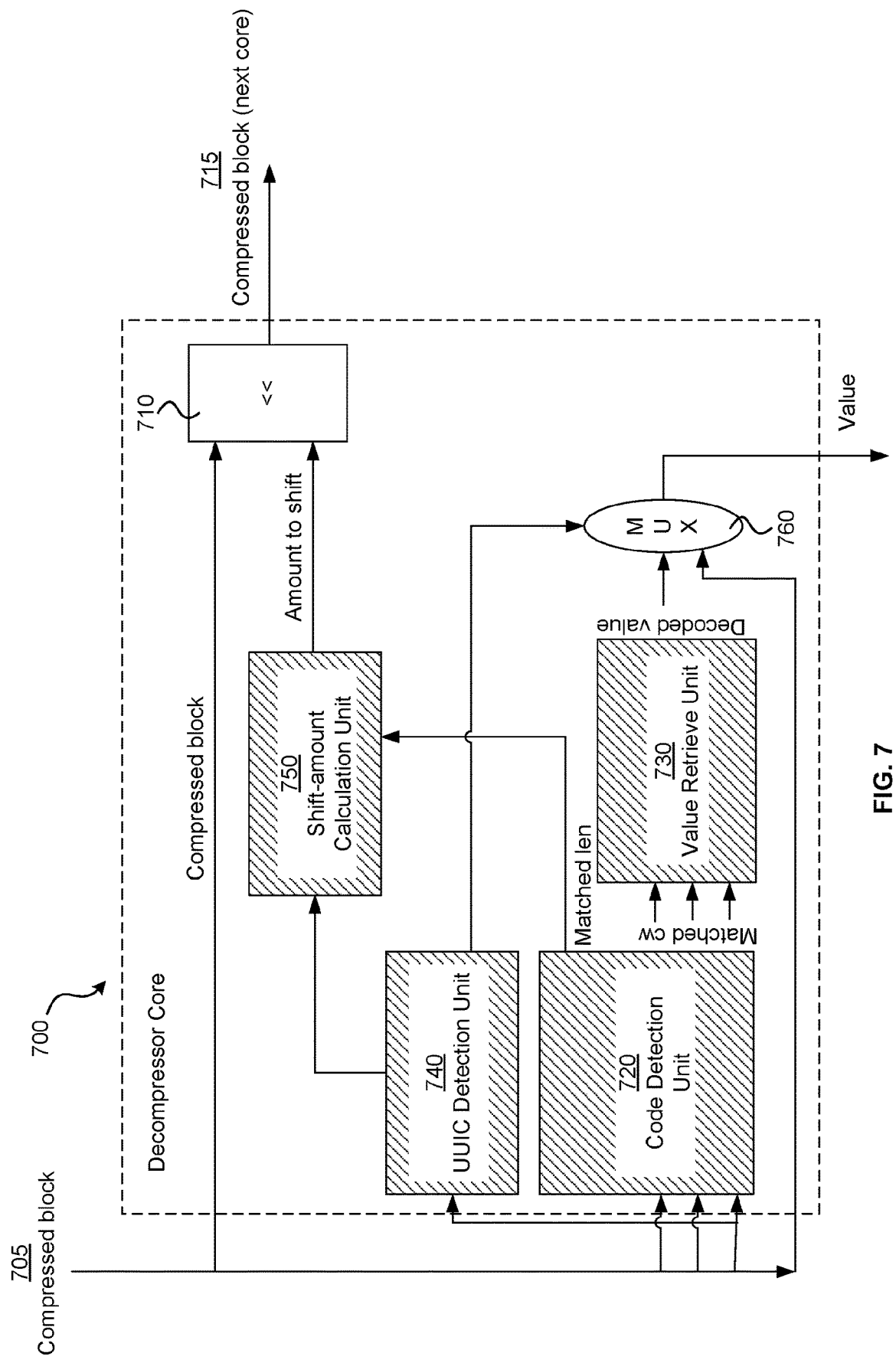
FIG. 7 illustrates a decompressor core redesigned to fit in the decompressor array of the present disclosure.

Hence, the output of the redefined decompressor is now one decompressed word and one compressed block, wherein the compressed block output does not comprise the same amount of compressed words compared to the number of compressed words that was fed to said decompressor. FIG. 7 shows the decompressor of FIG. 5 modified in such way that it allows it to become the decompressor core of the decompressor array of the present disclosure. The feedback of the code-word length from the codeword detection unit 520 through the shifter 510 back to the temporary compressed block 570 is modified so that the decompressor instead uses the output of the codeword detection unit (720, 750) together with the original compressed block 705 to shift said block 705 and forward the updated compressed block (715) to a subsequent decompressor (for example, the next decompressor in the array as shown later) with size of N−1 assuming that the compressed block is of size N. Importantly, the new decompressor core has no feedback of code-length towards to the original compressed block 705 in the same core.

Figure 8:
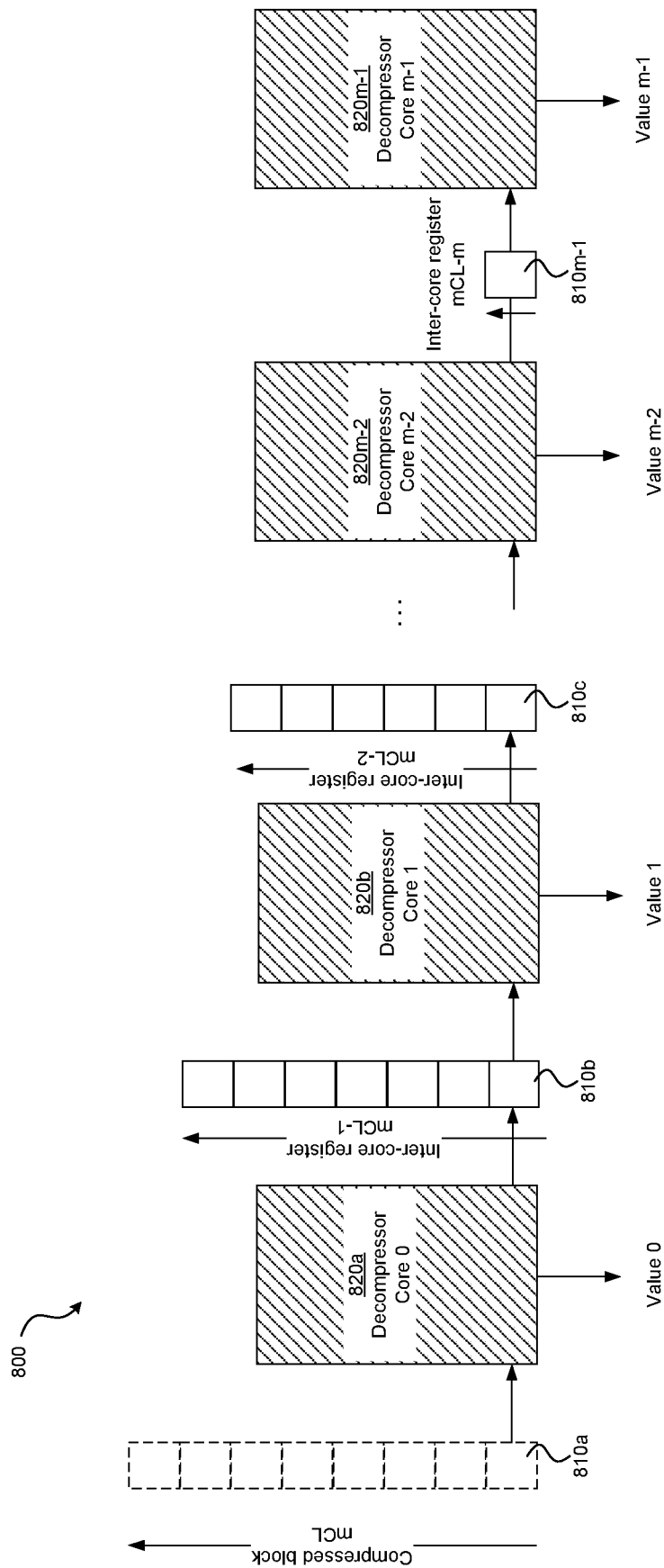
FIG. 8 illustrates a first embodiment of the decompressor array of the present disclosure, wherein each decompressor has one decompressed block as input and an output of a decompressed word together with decompressed block. The size in number of words of the compressed output block is one less compared to the number of words in the compressed input block. Suppose the number of words in the compressed input block is mCL then the size of the compressed output block would be mCL−1.

Let us assume that the number of compressed words in the compressed block that entered the decompressor is mCL, then the number of compressed words in a compressed block at the output of the decompressor will be mCL−1, as the decompressor decompresses only one word. The array decompressor has parallelism but in a different dimension: as opposed to state of the art which adds complete decompressor units in parallel as described previously, a plurality of the decompressor cores now form an array (or chain). An embodiment of an array decompressor is depicted in FIG. 8 comprising a plurality of m instances of the decompressor core of FIG. 7. Supposing that an "mCL" number of decompressors are used in a chain of decompressors wherein each one of them decompresses a specific word, the number of compressed words in the compressed block output at the last decompressor in the chain will be mCL−mCL=0, wherein all words in the original compressed block will have been entirely decompressed.

The redefined decompressor of the present disclosure thus decompresses part of the compressed block and forwards the reduced compressed block to the next decompressor in the chain. This has the following advantages: 1) By having each decompressor core reducing the compressed block and forwarding said reduced problem to the next decompressor it is possible to continue decompressing a word of a next compressed block. Henceforth, the new decompressor breaks the important dependency between the number of decompressors and the actual throughput of one decompressor, to decide how many decompressors must be used. 2) The number of decompressors needed for full throughput depends now only on the number of words, mCL, in a compressed block. 3) Furthermore, placing the decompressors in a chain solves the scheduling problem as the first decompressor in the chain is a single unit to feed for full throughput. 4) There is also no need for an extra block after the decompressor to be used to keep track of which decompressed block is which. 5) The codeword detection unit of the new decompressor core that has no internal feedback loop can be potentially better pipelined resulting in higher clock frequency in a hardware implementation. 6) The solution uses less logic and routing resources as the required shifting tapers of within each successive stage. 7) Removing the internal feedback of data simplifies the array layout, as shifted data are always forwarded to the next block.

The array decompressor of the present disclosure has a further advantage. Since the problem is reduced for each jump in the decompressor array, less logic can be used in the later part of the array. For example, the temporary buffer of each decompressor core 810a, 810b, 810c, is gradually of smaller size in comparison to decompressor cores earlier in the array because the compressed block arriving to each decompressor core has been reduced by the previous one by as much as determined by the minimum possible code-word length of the variable-length algorithm implemented by said decompressor. Moreover, the last decompressor core of the array can have a greatly reduced shifter as there are no subsequent decompressor cores. These can potentially result in area savings in comparison to previous designs especially for decompressing large blocks with multiple values. Second, even with the successively smaller shifter the shifting and prior code detection remain the most logically demanding (largest logic depth) operation within the decompressor core i.e. the code-detect and shift operation limit the achievable operational frequency of the core. However, because the decompressor array is strictly feedforward, pipeline-registers can be inserted to reduce the logic-depth without lowering the throughput of the decompressor array. Inserting a pipeline register in the decompressor 300 in prior art (FIG. 3.) would inevitably add one compute cycle before the decompressor can start decoding the next compressed word within a compressed block i.e. reducing the throughput of the decompressor.

The array decompressor of the present disclosure alleviates the limiting throughput and complexity of prior art variable-length decompressors by rearranging the compute order, but it does not solve the latency problem that is inherent due to the sequential nature of variable-length decoding. A second embodiment of the present disclosure, referred to as dual-end decompressor, can potentially increase the performance of variable-length decompression by decompressing a compressed block from two ends.

Figure 9:
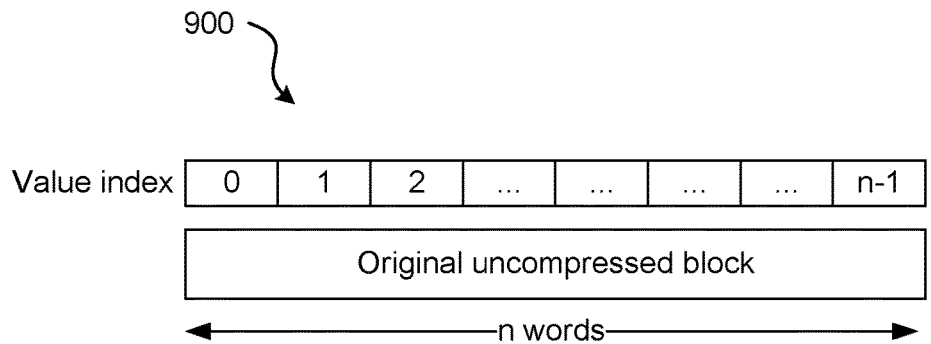
FIG. 9 illustrates an uncompressed block comprising a plurality of values whose index is 0 to n−1.
Figure 10:
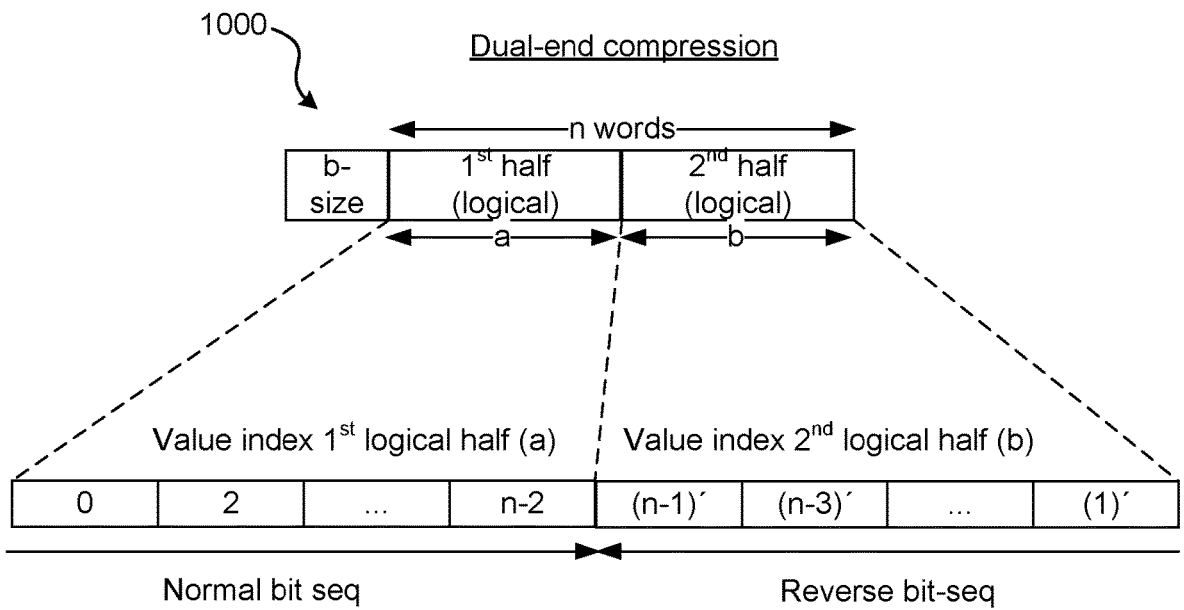
FIG. 10 illustrates a compressed block arranged in such way that it comprises two halves: the first half comprises the compressed words of even index while the second half comprises the compressed words of the odd index but in reversed bit sequence.

FIG. 9 illustrates an uncompressed block comprising a plurality of values whose index is 0 to n−1. FIG. 10 illustrates the compressed version of the block of FIG. 9, wherein the compressed block has been arranged in such way that it comprises two halves: the first half comprises the compressed words of even index (0, 2, 4, . . . , n−2) while the second half comprises the compressed words of the odd index (1, 3, 5, . . . , n−1) but in reversed bit sequence, therefore (n−1, n−3, . . . , 5, 3, 1). This arrangement can allow compressed block decompression from both ends at the same time.

Figure 11A:
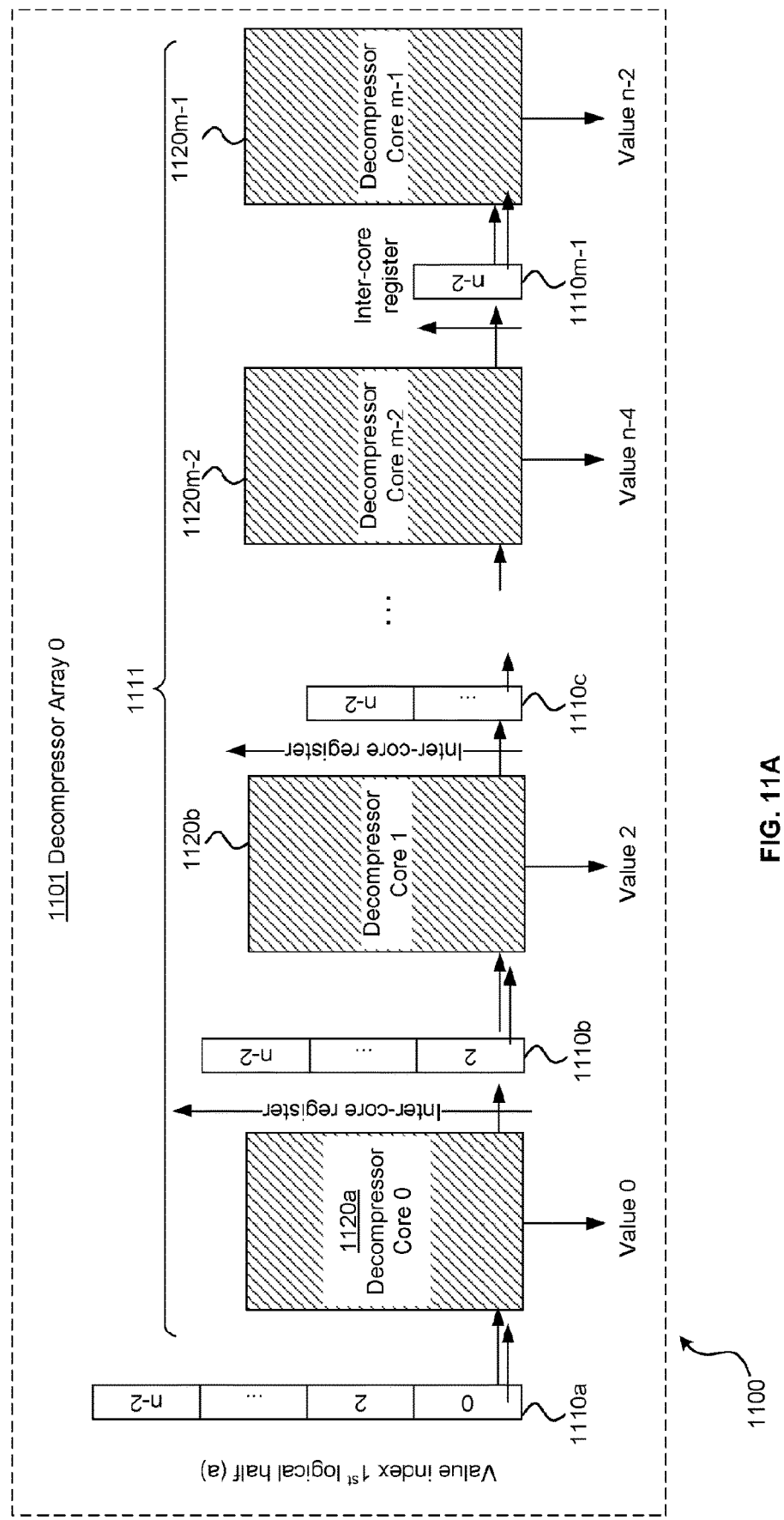
FIG. 11A illustrates a decompressor array used for decompressing a collection of compressed words (e.g., the collection of even-numbered words)
Figure 11B:
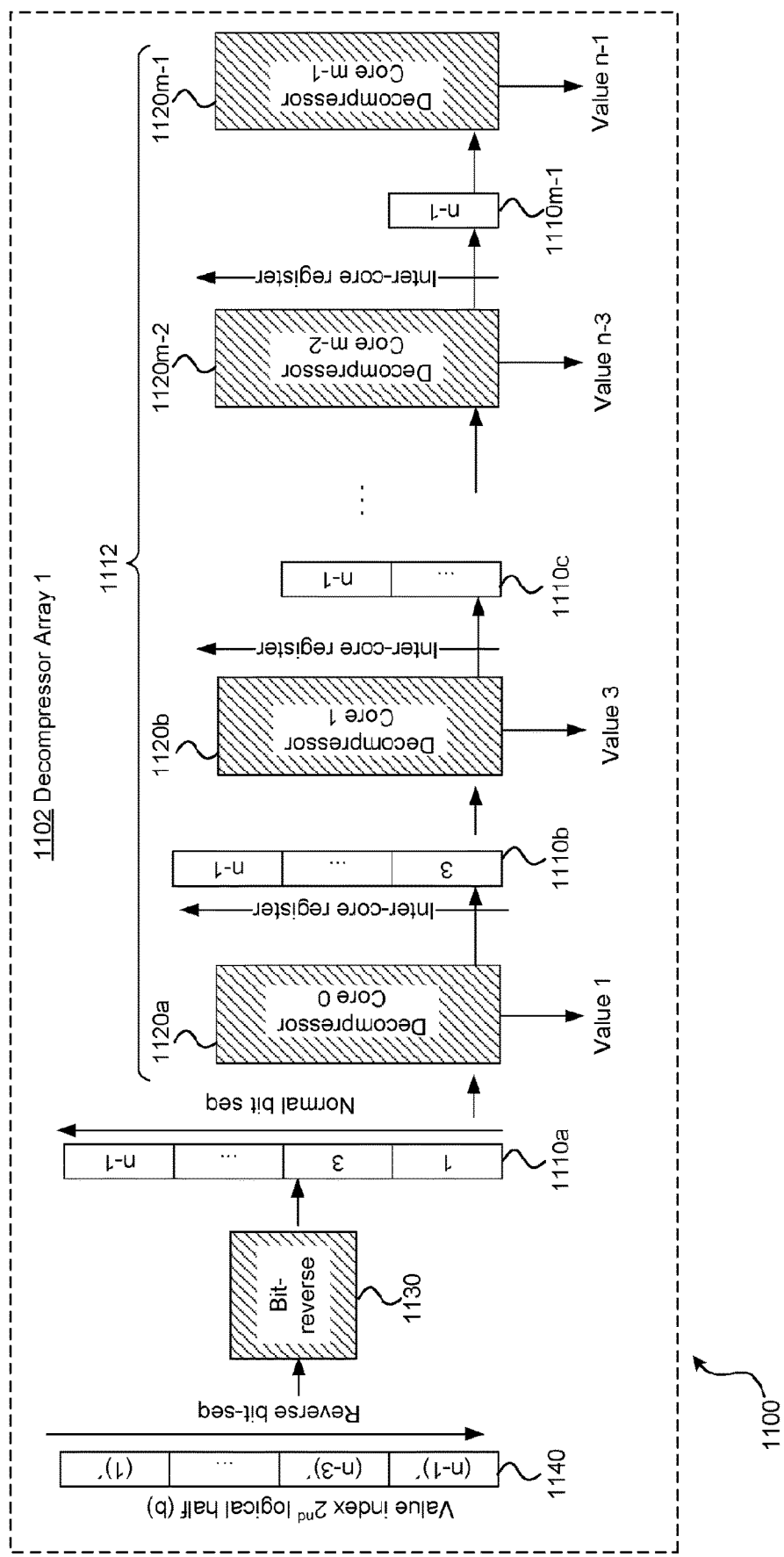
FIG. 11B illustrates a decompressor array that is enhanced with a bit-reversion pre-decompression unit to be able to decompress a bit-reversed collection of compressed words (e.g., the bit-reversed collection of odd-numbered words).

Using two instances of the array decompressors, for example the one of FIG. 8, it could be possible to use one array to decompress the even numbered collection of compressed words and the other array of decompressors to decompress the odd numbered collection of compressed words by feeding that array with a bit reversed version of the compressed block. FIG. 11 illustrates two embodiments of the decompressor array: FIG. 11A illustrates the decompressor array that is used to decompress the first logical half of the compressed block that comprises the even-numbered collection of the compressed words, while FIG. 11B illustrates the decompressor array that is used to decompress the second logical half of the compressed block that comprises the odd-numbered collection of the compressed words. Because said second logical half is bit-reversed, a bit re-reversion pre-decompression step is needed that is performed by the bit-reversion unit 1130 (also see corresponding unit 1330 in FIG. 13). The second logical half is stored in reversed bit sequence by the respective variable-length compressor that is explained later in para 0071. If the compressed block is divided into two sections within the same compressed block with one section of only odd numbered values and on section of only even numbered values the number of decompressors needed for each array of decompressors is reduced to mCL/2. The total number of decompressors would still be mCL but by dividing the array into two arrays with half the length the latency of decompressing a compressed block is also cut in half.

Figure 12:
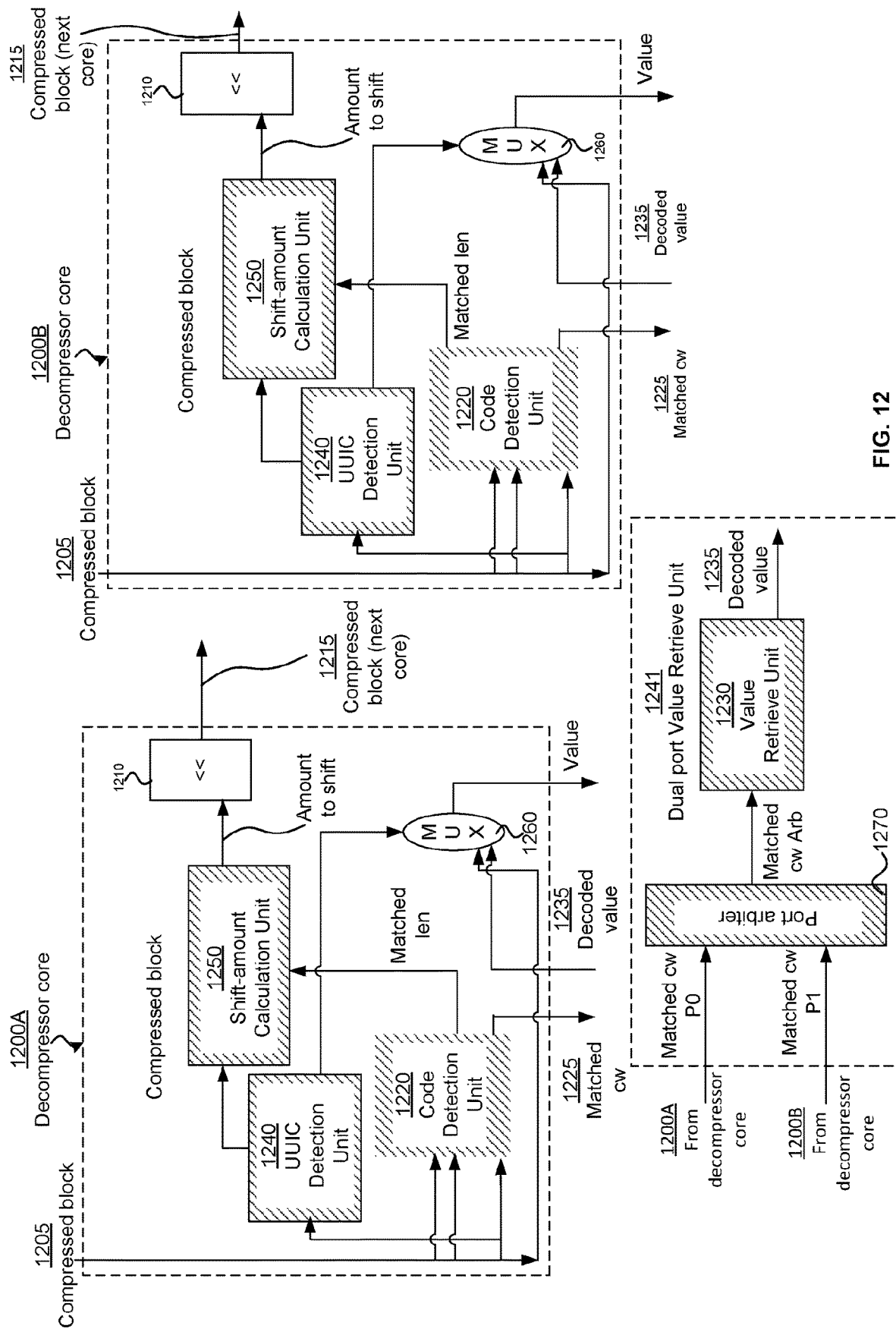
FIG. 12 illustrates the redefined decompressor cores such that a pair of cores can share one Dual Port Value Retrieve Unit also depicted in the figure.

Alternative embodiments of the dual-end decompressor can be realized so that a compressed block can be decompressed in parallel by multiple ends. The Value Retrieve Unit (530 in FIG. 5), can be typically the unit of the highest area overhead in variable-length decompressors as it comprises the mapping between code-words and data values. In a further embodiment of an array decompressor, shown in FIG. 13, the decompressor cores can be paired so that each pair utilizes one common Dual Port Value Retrieve Unit that is multiplexed between the paired decompressor cores (either time-shared between the two decompressor cores or fully shared if the Value Retrieve Unit can have two fully independent ports). The revised decompressor cores are depicted in FIG. 12 where the dedicated Value Retrieve Unit (1230) has been moved out of the core. The now shared Dual Port Value Retrieve unit has a port arbiter (1270) in order to select which decompressor core can access the Value Retrieve Unit. The advantage of this embodiment of the array decompressor is reduced area overhead for slightly larger decompression latency when the Value Retrieve Unit is time-shared. Another possibility is to create a true dual port Value Retrieve unit where resources that cannot be shared are duplicated. Conversely, resources such as the De-LUT (FIG-3 338), which is implemented in registers or SRAM and hence is responsible for most of the area requirement of the Value Retrieve unit, can be shared if a dual-port register-bank or SRAM is used. The advantage to this solution is slightly smaller area savings (due to resource replication), but no additional latency is introduced.

As has been explained in detail above with reference to FIG. 7 to FIG. 13, one aspect of the invention is a decompression system 800; 1100; 1300 for decompressing a compressed data block that comprises a plurality of compressed data values (e.g. words). The decompression system 800; 1100; 1300 comprises a plurality of decompression devices 700; 1200A-B (also referred to as decompression cores) that are arranged in an array or chain layout, as is seen at 820*a*-820*m*−1; 1120*a*-1120*m*−1; 1320*a*-1320*m*−1 in FIG. 8, FIG. 11 and FIG. 13. The decompression devices (or cores) are configured for decompressing respective compressed data values of the compressed data block. More specifically, a first decompression device 820*a*; 1120*a*; 1320*a* of the plurality of decompression devices is connected to a next decompression device 820*b*; 1120*b*; 1320*b* in the array or chain layout. Moreover, a last decompression device 820*m*−1; 1120*m*−1; 1320*m*−1 of the plurality of decompression devices is connected to a preceding decompression device 820*m*−2; 1120*m*−2; 1320*m*−2 in the array or chain layout.

The first decompression device 820*a*; 1120*a*; 1320*a* is configured to decompress a compressed data value of the compressed data block and reduce the compressed data block by extracting a codeword of the compressed data value and removing the compressed data value from the compressed data block, and moreover by retrieving a decompressed data value out of the extracted codeword, and passing the reduced compressed data block to the next decompression device (820*b*; 1120*b*; 1320*b*). The last decompression device 820*m*−1; 1120*m*−1; 1320*m*−1 is configured to receive a reduced compressed data block as reduced by the preceding decompression device 820*m*−2; 1120*m*−2; 1320*m*−2 and decompress another compressed data value of the compressed data block by extracting a codeword of said another compressed data value, and retrieving another decompressed data value out of the extracted codeword.

As can be seen in the disclosed embodiments, each decompression device 700; 1200A-B; 820a-820m−1; 1120a-1120m−1; 1320a-1320m−1 in the plurality of decompression devices is advantageously configured for decompressing one respective specific compressed data value of the compressed data block. Moreover, each individual decompression device 700; 1200A-B; 820a-820m−2; 1120a-1120m−2; 1320a-1320m−2 except for the last decompression device 820m-1; 1120m−1; 1320m−1 is configured for removing said one respective specific compressed data value from the compressed data block before passing the thus reduced compressed data block to a decompression device following after the individual decompression device in the array or chain layout.

In the first embodiment disclosed in FIG. 8, the first decompression device 820a is configured for receiving a full compressed data block 810a to be decompressed and for passing on, to the next decompression device 820b following after the first decompression device 820a in the array or chain layout, a reduced compressed data block 810b that comprises all compressed data values of the full compressed data block, except for the one compressed data value that was removed by the first decompression device 820a. The last decompression device 820m-1; 1120m−1; 1320m−1 is configured for receiving, from the preceding decompression device 820m-2; 1120m−2; 1320m−2 in the array or chain layout, a reduced compressed data block 810m−1 that comprises only a single compressed data value—all other compressed data value have been successively removed by the decompression devices 820a-820m−2.

Figure 13:
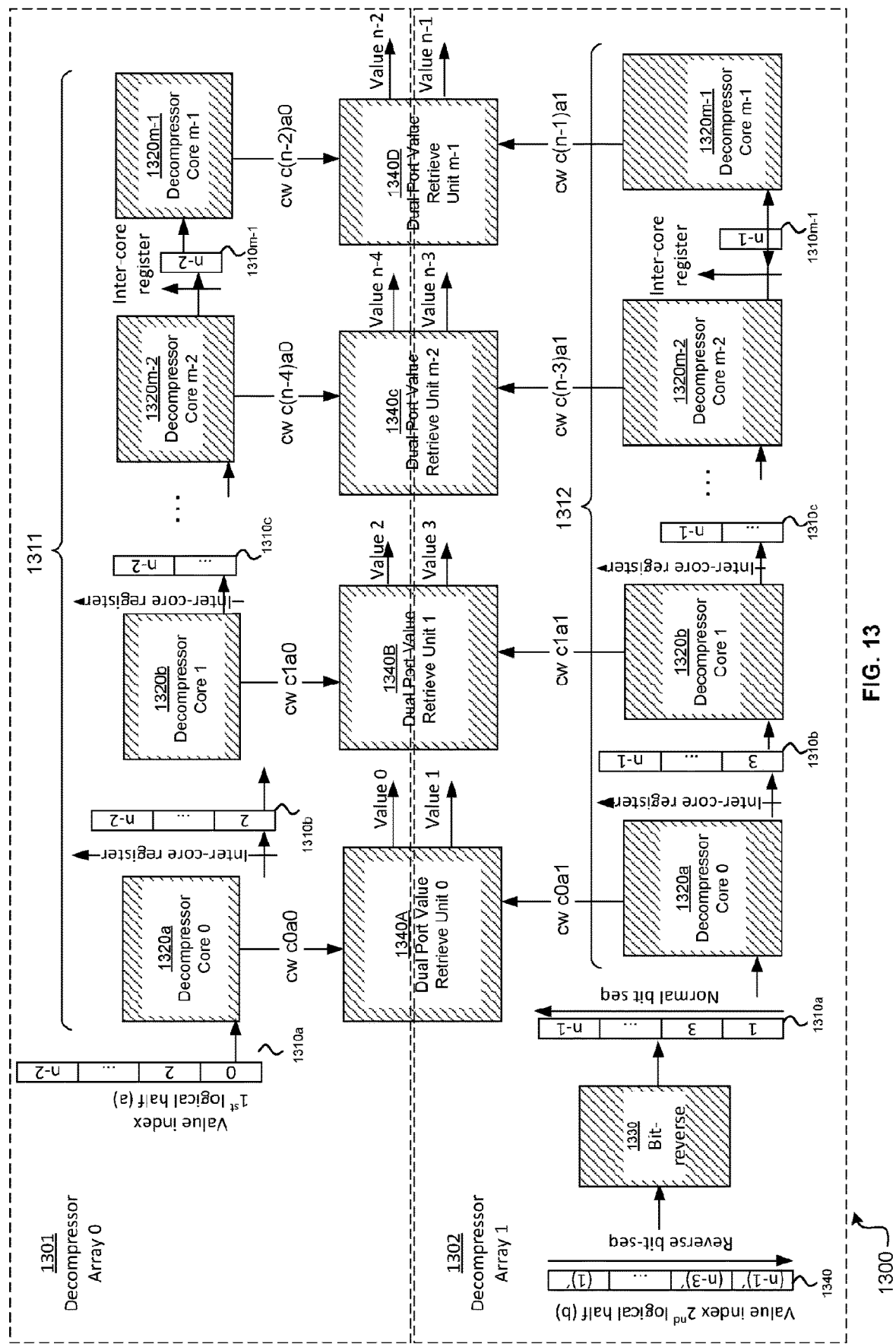
FIG. 13 illustrates a decompressor array configured so that a pair of decompressor cores share the same Value Retrieve Unit.

In the alternative embodiments disclosed in FIG. 11 and FIG. 13, the array or chain layout includes a first subgroup 1111; 1311 of the plurality of decompression devices arranged in a first array 1101; 1301. The array or chain layout further includes a second subgroup 1112; 1312 of the plurality of decompression devices arranged in a second array 1102; 1302. The decompression system 1100; 1300 is adapted for decompression of the compressed data block from two ends thereof, such that some of the plurality of compressed data values of the compressed data block are decompressed by the first subgroup 1111; 1311 of decompression devices, whereas others of the plurality of compressed data values of the compressed data block are decompressed by the second subgroup 1112; 1312 of decompression devices.

The decompression system 1100; 1300 may advantageously comprise a bit-reversion pre-decompression unit 1130; 1330 which is configured for reversing the bits of a bit sequence made up by the compressed data values that are to be processed by the second subgroup 1112; 1312 of decompression devices. To this end, the decompression devices of the first subgroup 1111; 1311 are configured to decompress compressed data values at even position indices in the compressed data block, whereas the decompression devices of the second subgroup 1112; 1312 are configured to decompress compressed data values at odd position indices in the compressed data block, or vice versa.

As can be seen particularly for the embodiment disclosed in FIG. 13, the decompression system 1300 may further comprise a value retrieve unit 1241; 1340A which is shared between the decompression devices 1200A; 1320a; 1200B; 1320a in each pair of decompression devices, wherein a pair consists of one decompression device 1200A; 1320a in the first subgroup 1311 and one decompression device 1200B; 1320a in the second subgroup 1312, Each decompression device 1200A; 1320a; 1200B; 1320a in the pair may comprise a code detection unit 1220 which is configured to detect a codeword of a compressed data value to be decompressed, and submit the detected codeword to the shared value retrieve unit 1241; 1340A. The shared value retrieve unit 1241; 1340A may be configured for retrieving decompressed data values out of the detected codewords from both decompression devices 1200A; 1320a; 1200B; 1320a in the pair. The shared value retrieve unit 1241; 1340A may typically operate by way of time sharing or by means of a port arbiter 1270 that controls which of the detected codewords are to be input to the value retrieve unit 1241; 1340A at each occasion.

A related aspect of the invention is a method for decompressing a compressed data block that comprises a plurality of compressed data values. The method comprises decompressing, by a first decompression device 820a; 1120a; 1320a in an array or chain layout of decompression devices 700; 1200A-B, a compressed data value of the compressed data block and reducing the compressed data block by extracting a codeword of the compressed data value and removing the compressed data value from the compressed data block, further retrieving a decompressed data value out of the extracted codeword, and passing the reduced compressed data block to a next decompression device 820b; 1120b; 1320b in the array or chain layout.

The method further comprises receiving, by a last decompression device 820m-1; 1120m−1; 1320m−1 in the array or chain layout, a reduced compressed data block as reduced by a preceding decompression device 820m-2; 1120m−2; 1320-2 in the array or chain layout, and decompressing another compressed data value of the compressed data block by extracting a codeword of said another compressed data value and retrieving another decompressed data value out of the extracted codeword.

The method may have any or all of the functional steps performable or provided by the decompression system 800; 1100; 1300 as described above Some non-exhaustive and non-limiting gains of the decompression system and method discussed above are: addressing the issue of limited throughput, reducing the complexity, no scheduler is needed, the number of decompressors needed for full throughput depends now only on the number of words, no internal feedback loop can be potentially better pipelined, the solution uses less logic and routing resources, and for the dual end decompressor, the latency of decompressing is cut in half.

Compressor

The major weakness of state-of-the-art statistical variable length compressors, such as the one depicted in FIG. 2, is their inherent sequential work-flow. The depicted compressor must completely exhaust the values, one at a time, pertaining to the uncompressed block 210 before starting on a subsequent uncompressed block. Hence the compression latency suffered by an uncompressed block is linear to the number of words within the uncompressed blocks. For instance, an uncompressed block consisting of n words will suffer n*Variable-length encoding latencies. The throughput is likewise limited to one uncompressed block every n*Variable-length encoding latencies. This latency can be hidden by replicating full compression units a sufficient number of times in a solution similar to the decompression. However, this solution suffers from similar drawbacks, i.e., a large area overhead and complex scheduling. A better solution is presented in the current disclosure which addresses both the latency issues faced by prior art implementations by effectively decoupling the latency of compression from the number of words in the uncompressed block. Furthermore, the throughput issues are addressed by allowing several uncompressed blocks to be processed at a time.

In a first embodiment of the present disclosure, the compressor method implemented by the compressor of FIG. 2 and FIG. 4 must be redefined so that 1) the inherently sequential process of packing each codeword into a compressed block is decoupled from the compressor device and relegated to a separate unit that packs the codeword output of all compressor devices; 2) each compression method or device is responsible for compressing only one word instead of all the words within the uncompressed block as opposed to prior art; and 3) several of said redefined compressors are arranged in an array (or chain) to, depending on performance requirements, partially or fully compress a block.

Figure 14:
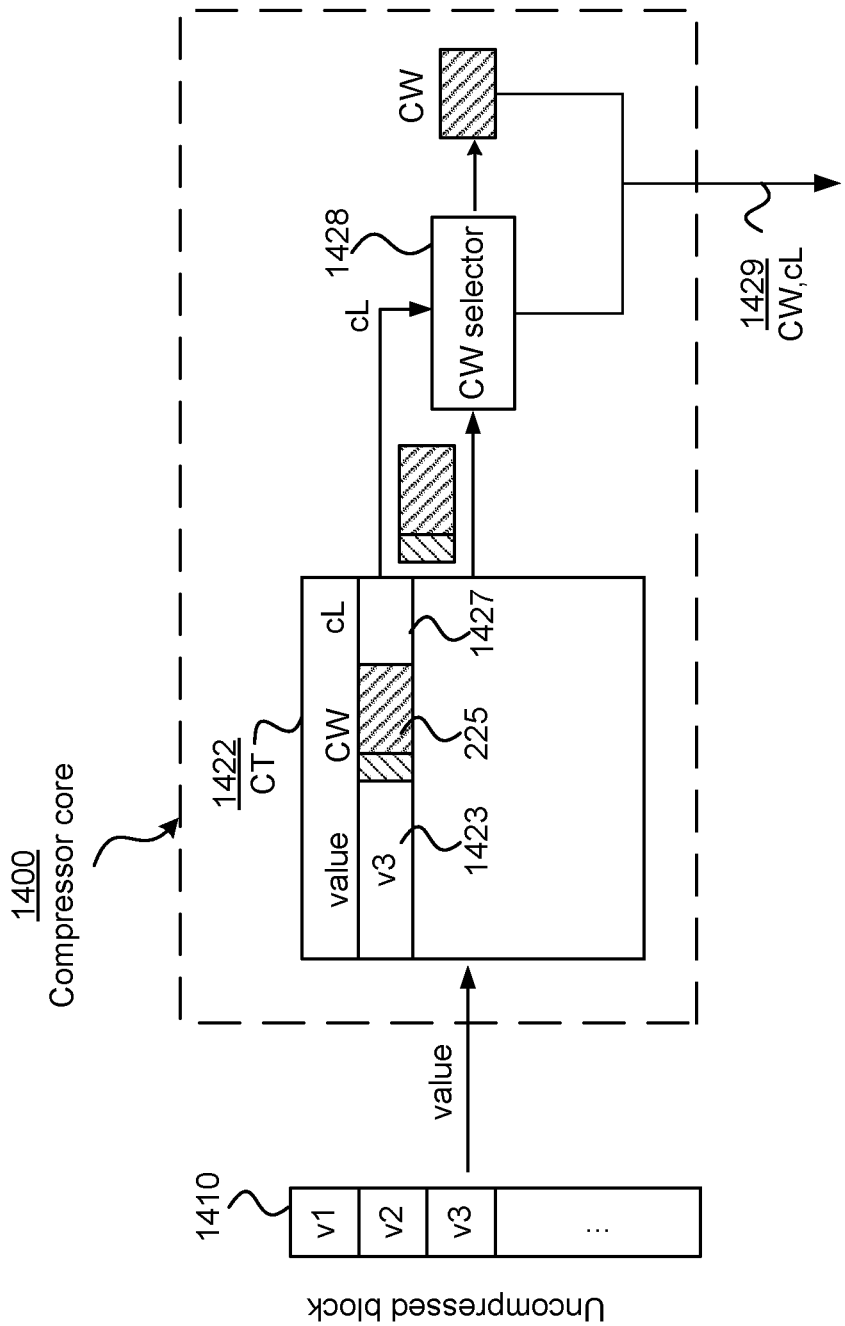
FIG. 14 illustrates a reduced compressor core that only does code-word detection on one word at a time. Such a compressor core allows for parallelization of the compression operation.
Figure 15:
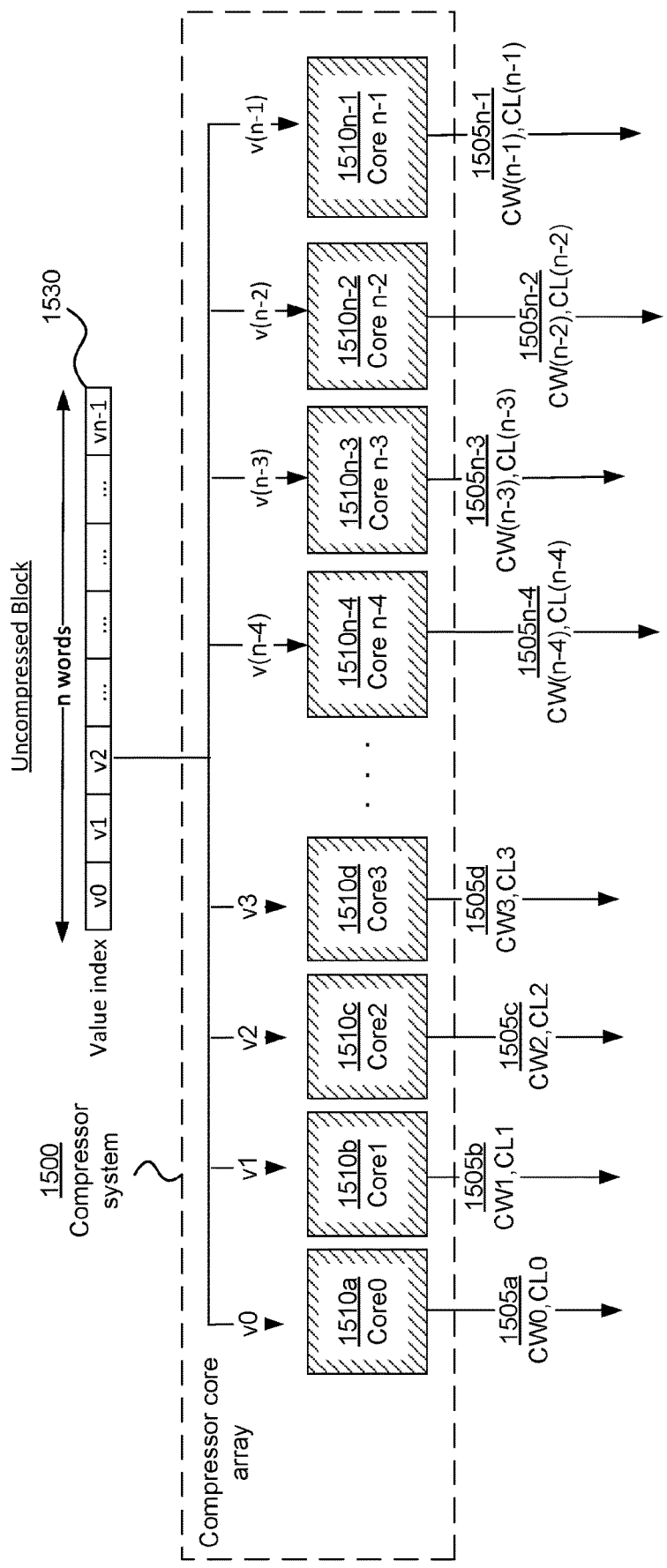
FIG. 15 illustrates n replicated compressor cores (as illustrated in FIG. 14) arranged in an array. The number n is set to match the input uncompressed block.

The redefined compressor device is depicted in FIG. 14 (1400). The packing functionality (FIG. 2 230) has been removed from the device which in effect reduces the device to variable-length encoding only. This is the compressor core which is further redefined to only work on one uncompressed word at a time. The output of a compressor core is therefore only one codeword and associated codeword-length which together form a CW/CL pair (1429). With the packing functionality removed one uncompressed block can be fed to several compressor cores, the number of which depends on performance requirements. FIG. 15 shows an example where a compressed block is composed of n words (1530). Maximum performance can be achieved if the number of compressor cores are also n (1510a-1510n-1). It follows that the uncompressed block will clear the compressor cores after a latency corresponding to one compressor-core latency. Furthermore, replicating the redefined compressor core comes at a lower area overhead compared to replicating the full compressor in FIG. 2.

A new unit, named packer unit, is created in order to handle the packing of all codewords outputted by the compressor cores. The input to the packer unit is CW/CL pairs numbering the same as the number of compressor cores used in the system. The packing is a complex operation with a large logic depth as each codeword is of variable length. Hence, a mux-tree is required to perform the packing, the depth of which depends on the number of codewords to be packed in one cycle. The logic depth in turn determines the frequency at which the packer (hence the compressor system) can operate at. In order to reduce the logic depth and increase the operating frequency the packer is arranged in an inverted-tree structure, where each level (stage) in the tree is separated by a register (implicit to each stage).

Figure 16:
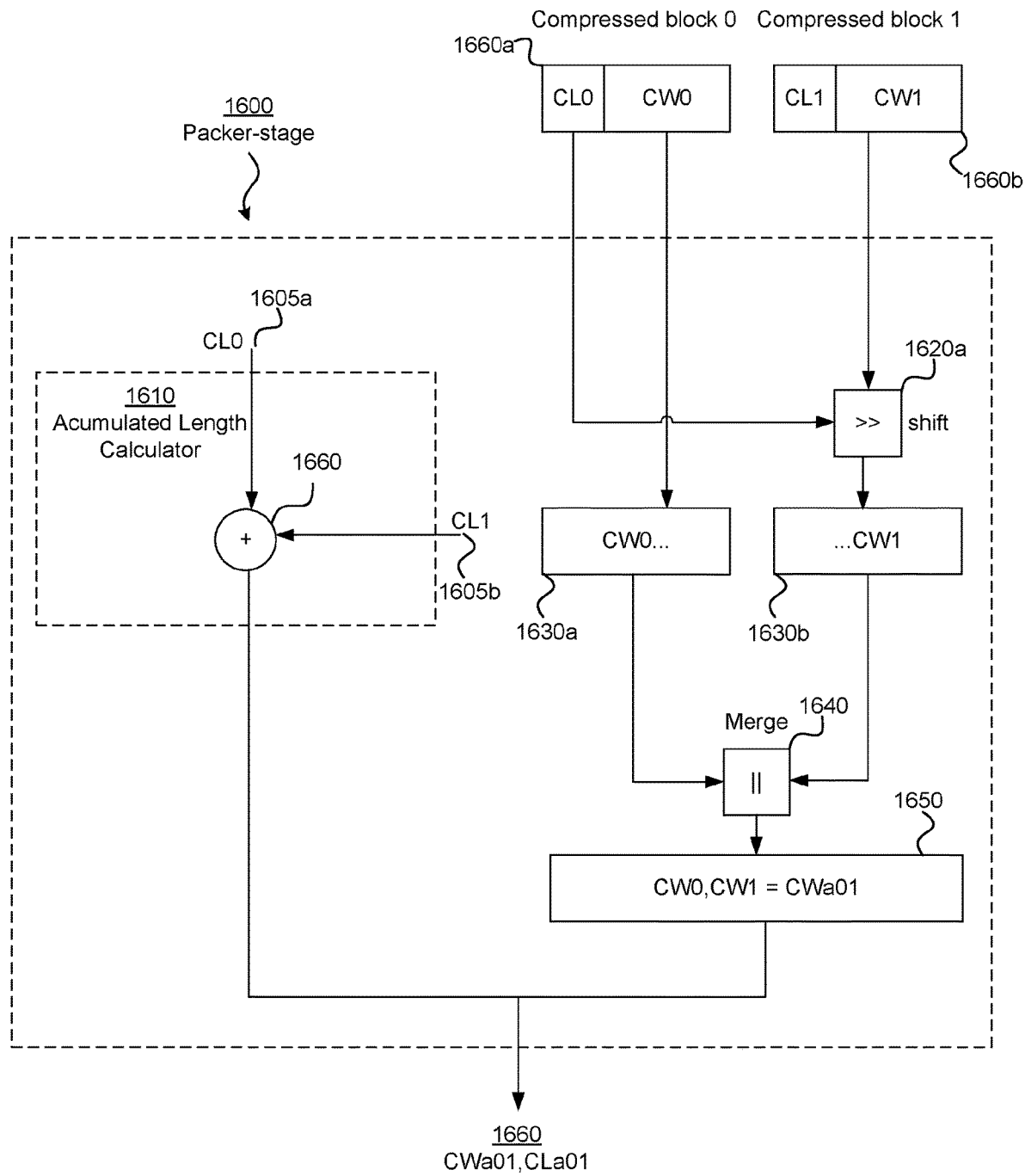
FIG. 16 illustrates a stage of the inverse-tree packer.

A packer stage is depicted in FIG. 16 where two CW/CL pairs, CW0/CL0 and CW1/CL1 respectively (1660a-b), are its inputs. The codewords are temporarily stored in two temporary buffers, 1630a-b, of suitable width. CW0 in the leftmost bits of buffer 1630a and CW1 is shifted right by CL0 and stored in the buffer 1630b. The two temporary buffers are subsequently joined by a merge operation (1640) to form the accumulated compressed block CWa01, which is stored in output register 1650. The length of the accumulated block is also calculated in the Accumulated Length Calculator (1610) by adding CL0 and CL1 to form CLa01 (the accumulated block length). The final output pair CWa01/CLa01 (1660) is then sent to the next stage in the packer unit.

Figure 17:
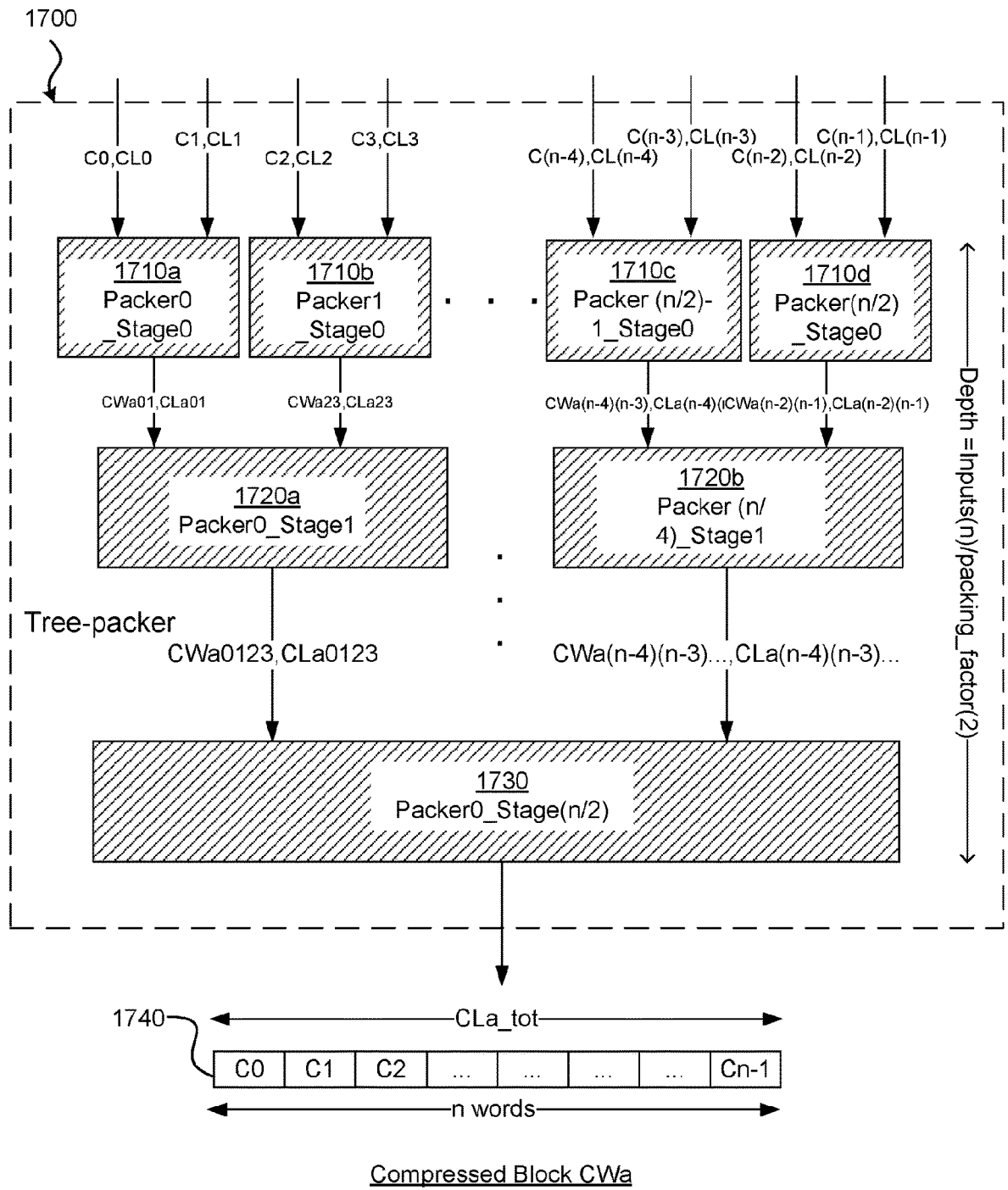
FIG. 17 illustrates a generic implementation of the inverse-tree packer, wherein the depth of the tree-structure is n/2 with n inputs and a packing factor of 2.

A full packer unit 1700 is obtained by replicating several packer stages and arranging them in an inverse-tree structure as shown in FIG. 17. The number of input CW/CL pairs to each stage is referred to as packing-factor. The packing-factor is assumed to be 2 in FIG. 17 but can be set to any number, preferably power of 2 (e.g., 2, 4, 8. . . ) in a hardware specific implementation. Increasing the packing-factor reduces the number of stages and hence the latency through the packer. However, this comes at the price of deeper logic depth in each stage which reduces the achievable target frequency. Each stage within the tree becomes successively wider (1710, 1720, 1730). More specifically, the internal buffers (1630a-b in FIG. 16) grows by the maximum allowed codeword-length. Consequently, the required shift operation becomes increasingly timing constrained and in order to alleviate this concern internal pipelining within the stages deeper down in the tree can be necessary. Since each stage in the packer unit is separated by register (i.e., the packer is pipelined), several blocks-under-compression can coexist in the packer.

Figure 18:
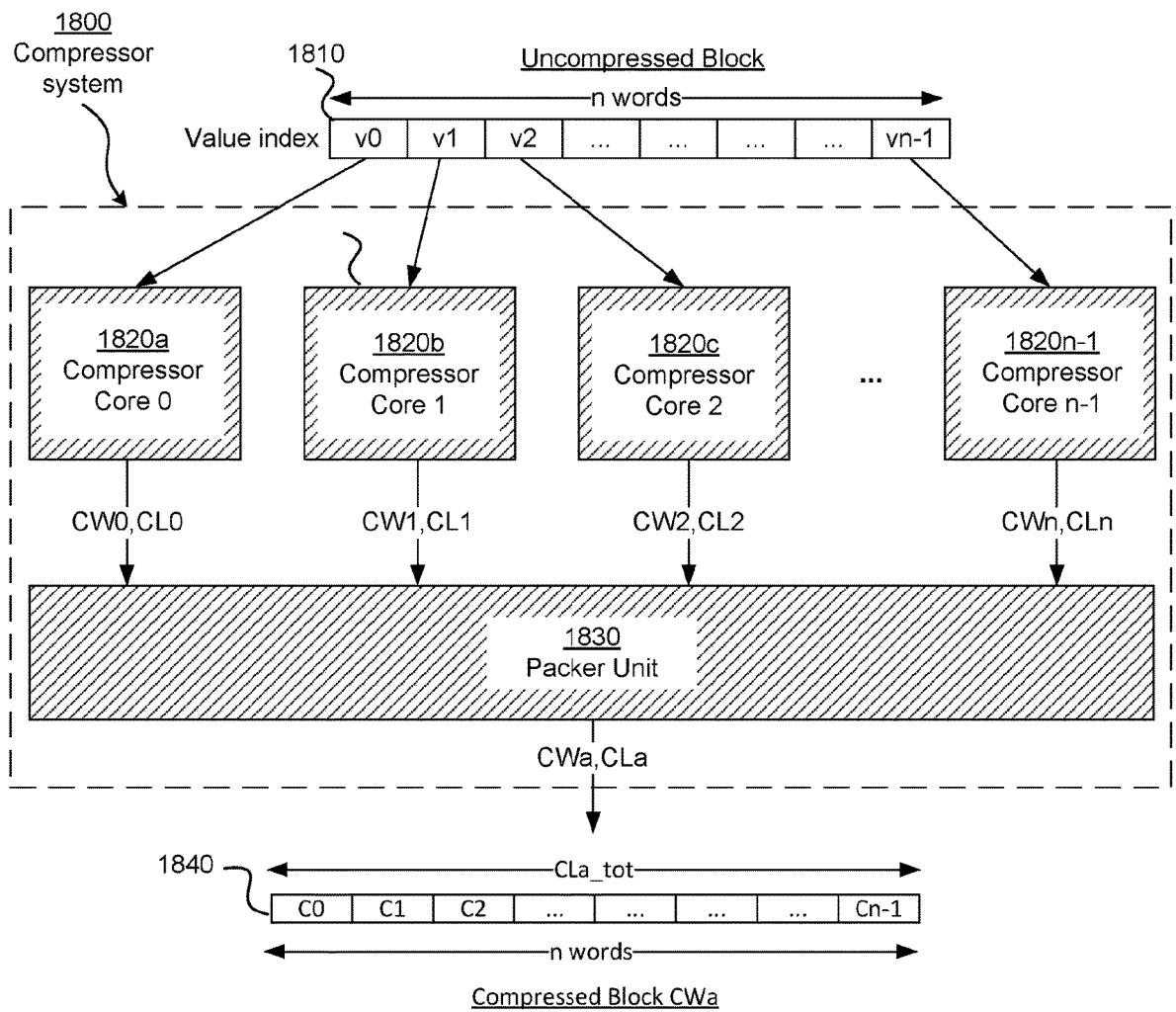
FIG. 18 illustrates the proposed array compressor. An uncompressed block comprised of n words is distributed on a word basis to an equal number of compressor cores. The inverse-tree packer creates the final compressed block output by packing the output of each compressor core.

An embodiment of the compressor system presented in this disclosure is depicted in FIG. 18. The uncompressed block (1810) is fed on a word-basis in parallel to each of the compressor cores (1820a-n-1) arranged in an array. Each compressor core outputs matched codeword with pertaining codeword-length after a set latency. The packer unit (1830) takes the CW/CL pairs and produces the final compressed block and length (1840). An uncompressed block would clear the redefined compressor after a latency corresponding to one compressor core latency (variable-length encoding latency) and n/2 packer-stage latencies, where n is the number of words in the uncompressed block. The throughput of this system is greatly improved with the tree-packer unit presented in this disclosure, wherein each packer-stage is separated by registers (i.e., pipelined) which allows several blocks-under-compression to be processed at any one time. In contrast, state of the art solutions suffers n*compressor-core latencies.

Figure 19:
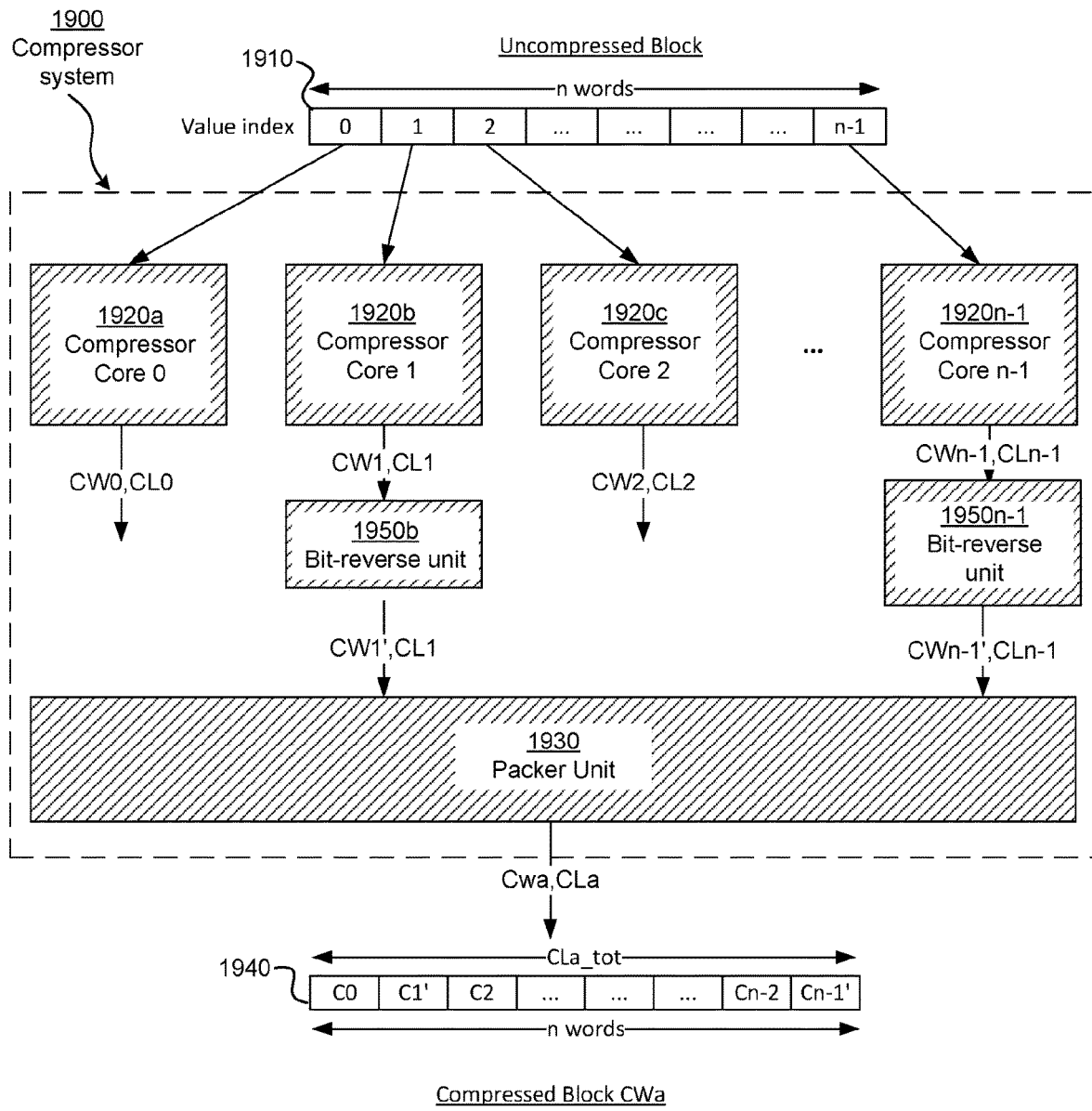
FIG. 19 illustrates the additional logic to form the final proposed array compressor that supports dual-ended compression.

Whilst adding dual-end support in the decompressor is a means to greatly reduce latency through the decompressor, adding dual end support in the compressor does not have a similar effect. However, the compression method and device must be altered in order to accommodate the changes in the decompression method and device for dual end support. FIG. 19 depicts the changes required to the compressor. A bit-reverse unit 1950 has been added to all odd numbered compressor-core outputs. The code-lengths remain unaffected and the packer unit also does not require any further modifications.

The immediate benefit of the present disclosure is the decoupling of compression latency from the number of words in an uncompressed block by exploiting the inherent parallelism in the variable-length encoding of the compression algorithm. The extent of parallelism to exploit can also be adapted to performance needs and area limitations. Furthermore, the inherent sequential portion of the compression algorithm, the packing of compressed codewords, has been reimagined in a tree-packer which efficiently pipelines the packing in order to increase the throughput. The number of stages in the tree-packer and hence the latency pertaining to the packing can be tuned to meet latency, area and frequency requirements of the target system.

As has been explained in detail above with reference to FIG. 14 to FIG. 19, another aspect of the invention is a compression system 1500; 1800; 1900 for compressing a data block 1530; 1810; 1910 that comprises a plurality of data values (e.g. words). The compression system may, advantageously but however not necessarily be used together with the decompression system described above. The compression system 1500; 1800; 1900 comprises a plurality of compression devices 1510a-1510n−1; 1820a-1820n−1; 1920a-1920n−1 (also referred to as compression cores). The compression devices (or cores) are arranged in an array or chain layout. The compression system 1500; 1800; 1900 additionally comprises a packer 1700; 1930 which is a standalone unit being separate from/independent of the plurality of compression devices.

Each compression device 1400 in the plurality of compression devices 1510a-1510n−1; 1820a-1820n−1; 1920a-1920n−1 is configured for compressing a respective one data value of the data block 1530; 1810; 1910, and outputting a compressed representation of the respective one data value to the packer 1700; 1930. The packer 1700; 1930 is configured for receiving the compressed representations CW, CL of the respective data values as compressed by the plurality of compression devices 1510a-1510n−1; 1820a-1820n−1; 1920a-1920n−1, and generating a compressed data block 1740; 1840; 1940 from the compressed representations CW, CL.

In embodiments of the compression system 1500; 1800; 1900, the compressed representations of the respective data values compressed by the plurality of compression devices 1510a-1510n−1; 1820a-1820n−1; 1920a-1920n−1 comprise codewords CW and associated codelengths CL. The packer 1700; 1930 is configured for generating the compressed data block 1740; 1840; 1940 by combining the codewords CW of the compressed representations into the compressed data block.

As the skilled person will readily realise from the disclosure in the document, the plurality of compression devices 1510a-1510n−1; 1820a-1820n−1; 1920a-1920n−1 operate in parallel when compressing the respective data values of the data block 1530; 1810; 1910 and outputting the compressed representations CW, CL of the respective data values.

Moreover, the packer 1700; 1930 may advantageously be pipelined, such that the packer 1700; 1930 comprises a plurality of packer stages 1600; 1710a-1710d, 1720a-b, 1730 separated by registers in a pipelined configuration.

As was explained above with particular reference to FIG. 19, the compression system 1900 may advantageously be dual-ended in order to facilitate operation with the embodiments of the decompression system 1100; 1300 in FIG. 11 and FIG. 13. Accordingly, the compression system 1900 may further comprise a bit-reverse unit 1950b, 1950n−1 for every second compression device 1920b, 1920n−1 of the plurality of compression devices 1920a-1920n−1, each bit-reverse unit 1950b, 1950n−1 being configured for reversing the bits of the codeword CW provided by the associated compression device and for submitting the thus reversed codeword CW' to the packer 1950.

A related aspect of the invention is a method for compressing a data block 1530; 1810; 1910) that comprises a plurality of data values. The method comprises providing a plurality of compression devices 1510a-1510n−1; 1820a-1820n−1; 1920a-1920n−1 which are arranged in an array or chain layout.

The method provides a packer 1700; 1930 as a standalone unit separate from the plurality of compression devices. The method then involves compressing, by each compression device 1400 in the plurality of compression devices 1510a-1510n−1; 1820a-1820n−1; 1920a-1920n−1, a respective one data value of the data block 1530; 1810; 1910.

The method further involves outputting a compressed representation of the respective one data value to the packer 1700; 1930, and receiving, by the packer 1700; 1930, the compressed representations CW, CL of the respective data values as compressed by the plurality of compression devices 1510a-1510n−1; 1820a-1820n−1; 1920a-1920n−1.

The method finally involves generating, by the packer 1700; 1930, a compressed data block 1740; 1840; 1940 from the compressed representations CW, CL. The method may have any or all of the functional steps performable or provided by the compression system 1500; 1800; 1900 as described above.

Some further non-exhaustive and non-limiting gains of the compression system and method discussed above are: Variable code-length encoding, i.e. detection of codewords CW and pertaining codeword length CL, inherently parallel but limited by sequential packing. Sequential packing, i.e. process one word at a time, which leads to high latency and low throughput and as a result low performance. Latency decoupled from the number of words in the uncompressed block. Throughput is greatly improved because of several blocks-under-compression at any one time. The area and performance (latency) can be adapted after design requirements.

Further alternative aspects of the present disclosure are described in the following numbered clauses.

Clause 1: A decompression system for decompressing compressed data blocks comprising one or a plurality of decompression devices (decompression cores) arranged in an array layout (or chain); wherein a. a compressed data block comprises one or a plurality of compressed data values;

b. each decompression device decompresses one compressed data value;

c. the decompression devices are arranged in an array so that a first decompression device is connected to a second decompression device, wherein:

i. the first decompression device decompresses a compressed data value of said compressed data block and therefore reduces said compressed data block by extracting the codeword of the associated compressed data value decompressed by said first decompression device and removing it of said compressed data block, and therefore retrieving decompressed data value out of said extracted codeword and passing said reduced compressed data block to a second decompression device;

ii. the second decompression device decompresses a compressed data value of said compressed data block and therefore reduces said compressed data block by extracting the codeword of the associated compressed data value decompressed by said first decompression device and removing it of said compressed data block, and therefore retrieving decompressed data value out of said extracted codeword.

As regards item ii. above, it is noticed that the second can be connected to a third, etc etc, but the last one does not have a next one so it will only retrieve the decompressed value. Therefore, an array of two decompressors where the second has the scope here is intended to cover all the possible cases.

Clause 2: Each decompressor device of system of clause 1, decompresses a specific value in the compressed block, which can be straightforwardly wired to a specific value in the decompressed block without further logic.

Clause 3: The decompression device has no internal feedback loop as it forwards the updated block to another device Clause 4: Each decompression device of array decompressor of clause 1, reduces the compressed block by one compressed value before passing the block to the next one Clause 5: Dual-end decompression system that decompresses a compressed data block from two ends at the same time, wherein the second array instance decompresses a part of the compressed data block that is stored in reversed bit order.

d. Can be generalized to multi-end decompression system as long as the starting point of each end in the compressed block is somehow known (it is noticed that this is related to the metadata problem of eg translation rather than the decompression. However, multi-end decompression is part of this disclosure)
  e. One decompression array instant of the dual end decompression device decompresses compressed values of a specific groupA and the other of a specific groupB
    i. For example, One decompression array instant of the dual end decompression device decompresses compressed values of odd index and the other of even index
  f. Resource-sharing embodiment Clause 6: Each decompression device can be pipelined to further achieve better clock frequency.

Clause 7: The whole decompression system of clause 1 further pipelined.

Clause 8: A method comprising the functionality performed by the structural elements referred to above.

Clause 9:
1. A compression system for compressing data blocks comprising one or a plurality of compression devices (compression cores) arranged in an array layout (or chain); wherein
  a. a data block comprises one or a plurality of data values;
  b. each compression device compresses one data value;
    i. in said compression device, the value compression unit and the packing unit of compressed data values are decoupled (it is noticed that the packing unit becomes a standalone unit of the whole compression system in the present disclosure)
  c. the compression devices are arranged in an array so that a first compression device and a second compression device are connected to a packer; wherein
    i. the first compression device compresses a first data value of the data block and the second compression device compresses a second data value of said data block
      1. First and second compression devices are independent to each other;
      2. Compression of said first and second devices can happen (preferably) in parallel, or sequentially
    ii. Said packer collects the compressed version of the first data value (CW and CL) and the compressed version of the second data value (CW and CL) and combines them into a compacted and compressed data sequence that comprises the first codeword and the second codeword.
      1. Packer can be pipelined;
      2. Said packer can be a tree packer;
        a. Depth of tree depends on number of words in uncompressed block and packing-factor (number of inputs to each stage in the tree).
        b. Tree can be implemented as a binary tree, but can be any tree
        c. Pipelined tree packer by separating packer stages using registers Clause 10: Dual-end compression system Clause 11: A method comprising the functionality performed by the structural elements referred to above.

The invention claimed is:

1. A decompression system for decompressing a compressed data block that comprises a plurality of compressed data values, the decompression system comprising:
  a plurality of decompression devices arranged in an array or chain layout, the decompression devices being configured for decompressing respective compressed data values of said compressed data block, wherein:
  a first decompression device of said plurality of decompression devices is connected to a next decompression device in the array or chain layout;
  a last decompression device of said plurality of decompression devices is connected to a preceding decompression device in the array or chain layout;
  the first decompression device is configured to decompress a compressed data value of said compressed data block and reduce said compressed data block by:
    extracting a codeword of said compressed data value and removing said compressed data value from the compressed data block,
    retrieving a decompressed data value out of the extracted codeword, and
    passing the reduced compressed data block to the next decompression device; and
  the last decompression device is configured to receive a reduced compressed data block as reduced by the preceding decompression device and decompress another compressed data value of said compressed data block by:
    extracting a codeword of said another compressed data value, and
    retrieving another decompressed data value out of the extracted codeword.

2. The decompression system as defined in claim 1, wherein each decompression device in said plurality of decompression devices is configured for decompressing one respective specific compressed data value of said compressed data block.

3. The decompression system as defined in claim 2, wherein each individual decompression device except said last decompression device is configured for removing said one respective specific compressed data value from the compressed data block before passing the thus reduced compressed data block to a decompression device following after said individual decompression device in the array or chain layout.

4. The decompression system as defined in claim 1, wherein:
  the first decompression device is configured for receiving a full compressed data block to be decompressed and for passing on, to the next decompression device following after said first decompression device in the array or chain layout, a reduced compressed data block that comprises all compressed data values of the full compressed data block, except for one compressed data value; and
  the last decompression device is configured for receiving, from the preceding decompression device in the array or chain layout, a reduced compressed data block that comprises only a single compressed data value.

5. The decompression system as defined in claim 4, wherein:
  each decompression device in said plurality of decompression devices is configured for decompressing one respective specific compressed data value of said compressed data block, and each individual decompression device except said last decompression device is configured for removing said one respective specific compressed data value from the compressed data block before passing the thus reduced compressed data block to a decompression device following after said individual decompression device in the array or chain layout.

6. The decompression system as defined in claim 1, wherein said array or chain layout includes a first subgroup of said plurality of decompression devices arranged in a first array and a second subgroup of said plurality of decompression devices arranged in a second array, the decompression system being adapted for decompression of the compressed data block from two ends thereof, such that some of said plurality of compressed data values of the compressed data block are decompressed by the first subgroup of decompression devices and others of said plurality of compressed data values of the compressed data block are decompressed by the second subgroup of decompression devices.

7. The decompression system as defined in claim 6, wherein the decompression devices of the first subgroup are configured to decompress compressed data values at even position indices in the compressed data block and the decompression devices of the second subgroup are configured to decompress compressed data values at odd position indices in the compressed data block, or vice versa.

8. The decompression system as defined in claim 5, further comprising, for each pair of decompression devices consisting of one decompression device in the first subgroup and one decompression device in the second subgroup, a value retrieve unit which is shared between the decompression devices in the pair.

9. The decompression system as defined in claim 8,
wherein each decompression device in the pair comprises a code detection unit configured to:
detect a codeword of a compressed data value to be decompressed, and
submit the detected codeword to the shared value retrieve unit; and
wherein the shared value retrieve unit is configured for:
retrieving decompressed data values out of the detected codewords from both decompression devices in the pair.

10. The decompression system as defined in claim 9, wherein the shared value retrieve unit operates by way of time sharing or by means of a port arbiter that controls which of the detected codewords are input to the value retrieve unit at each occasion.

11. The decompression system as defined in claim 8, wherein:
each decompression device in said plurality of decompression devices is configured for decompressing one respective specific compressed data value of said compressed data block, and
each individual decompression device except said last decompression device is configured for removing said one respective specific compressed data value from the compressed data block before passing the thus reduced compressed data block to a decompression device following after said individual decompression device in the array or chain layout.

12. The decompression system as defined in claim 6, further comprising a bit-reversion pre-decompression unit configured for reversing the bits of a bit sequence made up by the compressed data values that are to be processed by the second subgroup of decompression devices.

13. The decompression system as defined in claim 6, wherein:
each decompression device in said plurality of decompression devices is configured for decompressing one respective specific compressed data value of said compressed data block, and
each individual decompression device except said last decompression device is configured for removing said one respective specific compressed data value from the compressed data block before passing the thus reduced compressed data block to a decompression device following after said individual decompression device in the array or chain layout.

14. A method for decompressing a compressed data block that comprises a plurality of compressed data values, the method comprising:
decompressing, by a first decompression device in an array or chain layout of decompression devices, a compressed data value of said compressed data block and reducing said compressed data block by:
extracting a codeword of said compressed data value and removing said compressed data value from the compressed data block,
retrieving a decompressed data value out of the extracted codeword, and
passing the reduced compressed data block to a next decompression device in the array or chain layout; and
receiving, by a last decompression device in the array or chain layout, a reduced compressed data block as reduced by a preceding decompression device in the array or chain layout and decompressing another compressed data value of said compressed data block by:
extracting a codeword of said another compressed data value, and
retrieving another decompressed data value out of the extracted codeword.

15. A method for compressing a data block that comprises a plurality of data values, the method comprising:
providing a plurality of compression devices arranged in an array or chain layout;
providing a packer being a standalone unit separate from the plurality of compression devices;
compressing, by each compression device in said plurality of compression devices, a respective one data value of the data block;
outputting a compressed representation of the respective one data value to the packer;
receiving, by the packer, the compressed representations of the respective data values as compressed by the plurality of compression devices; and
generating, by the packer, a compressed data block from the compressed representations.

16. A compression system for compressing a data block that comprises a plurality of data values, the compression system comprising:
a plurality of compression devices arranged in an array or chain layout; and
a packer being a standalone unit separate from the plurality of compression devices, wherein each compression device in said plurality of compression devices is configured for:
compressing a respective one data value of the data block, and
outputting a compressed representation of the respective one data value to the packer, and
wherein the packer is configured for:

receiving the compressed representations of the respective data values as compressed by the plurality of compression devices, and generating a compressed data block from the compressed representations.

17. The compression system as defined in claim 16, wherein the compressed representations of the respective data values compressed by the plurality of compression devices comprise codewords and associated codelengths, and wherein the packer is configured for generating the compressed data block by combining the codewords of the compressed representations into the compressed data block.

18. The compression system as defined in claim 17, further comprising a bit-reverse unit for every second compression device of the plurality of compression devices, each bit-reverse unit being configured for reversing the bits of the codeword provided by the associated compression device and for submitting the thus reversed codeword to the packer.

19. The compression system as defined in claim 16, wherein the plurality of compression devices operate in parallel when compressing the respective data values of the data block and outputting the compressed representations of the respective data values.

20. The compression system as defined in claim 16, wherein the packer comprises a plurality of packer stages separated by registers in a pipelined configuration.

* * * * *